United States Patent [19]
Clark, II et al.

[11] Patent Number: 6,069,573
[45] Date of Patent: May 30, 2000

[54] MATCH AND MATCH ADDRESS SIGNAL PRIORITIZATION IN A CONTENT ADDRESSABLE MEMORY ENCODER

[75] Inventors: Airell R. Clark, II, Albany, Oreg.; Brian R. Jung, Poway, Calif.

[73] Assignee: Hewlett-Packard Company, Palo Alto, Calif.

[21] Appl. No.: 08/920,665

[22] Filed: Aug. 29, 1997

Related U.S. Application Data

[63] Continuation-in-part of application No. 08/664,902, Jun. 17, 1996, Pat. No. 5,828,324.

[51] Int. Cl.[7] ................................................. H03M 7/00
[52] U.S. Cl. .................................. 341/50; 711/108
[58] Field of Search ............................... 341/50; 365/49; 711/108

[56] References Cited

U.S. PATENT DOCUMENTS

| | | | |
|---|---|---|---|
| 3,701,980 | 10/1972 | Mundy | 340/173 |
| 4,780,845 | 10/1988 | Threewitt | 365/49 |
| 4,881,075 | 11/1989 | Weng | 341/87 |
| 5,123,105 | 6/1992 | Wyland et al. | 341/102 |
| 5,175,543 | 12/1992 | Lantz | 341/51 |
| 5,373,290 | 12/1994 | Lempel et al. | 341/51 |
| 5,379,070 | 1/1995 | Retter et al. | 348/403 |
| 5,455,576 | 10/1995 | Clark, II et al. | 341/50 |
| 5,649,149 | 7/1997 | Stormon et al. | 395/435 |

FOREIGN PATENT DOCUMENTS

| | | | |
|---|---|---|---|
| 0 313 190 A3 | 7/1990 | European Pat. Off. | H03M 7/42 |
| 0 380 294 A1 | 8/1990 | European Pat. Off. | G06F 7/02 |

OTHER PUBLICATIONS

"Practical Dictionary Management For Hardware Data Compression", By Ziv & Lempel, Development of a Theme, Department of Computer Science & Engineering FR–35 University of Washington Seattle WA 98195, pp. 33–50.

"Compression Of Individual Sequences Via Variable–Rate Coding", By Jacob Ziv and Abraham Lempel, IEEE Transactions on Information Theory, vol. IT–24, No. 5, Sep. 1978.

*Primary Examiner*—Howard L. Williams

[57] ABSTRACT

A method and apparatus for prioritizing encoded MATCH signal and MATCH ADDRESS signals for a content addressable memory ("CAM") array is disclosed. Each CAM core has an output encoder for providing a MATCH signal and, if a MATCH is determined, a MATCH_ADDRESS signal indicative of locations in the CAM of the data of interest. The priority encoder output signals are encoded to provide a final MATCH signal and a final MATCH_ADDRESS to only the highest priority MATCH_ADDRESS from the CAM core having the data, solving the problem of determining which of a plurality of CAM matches to select.

7 Claims, 24 Drawing Sheets

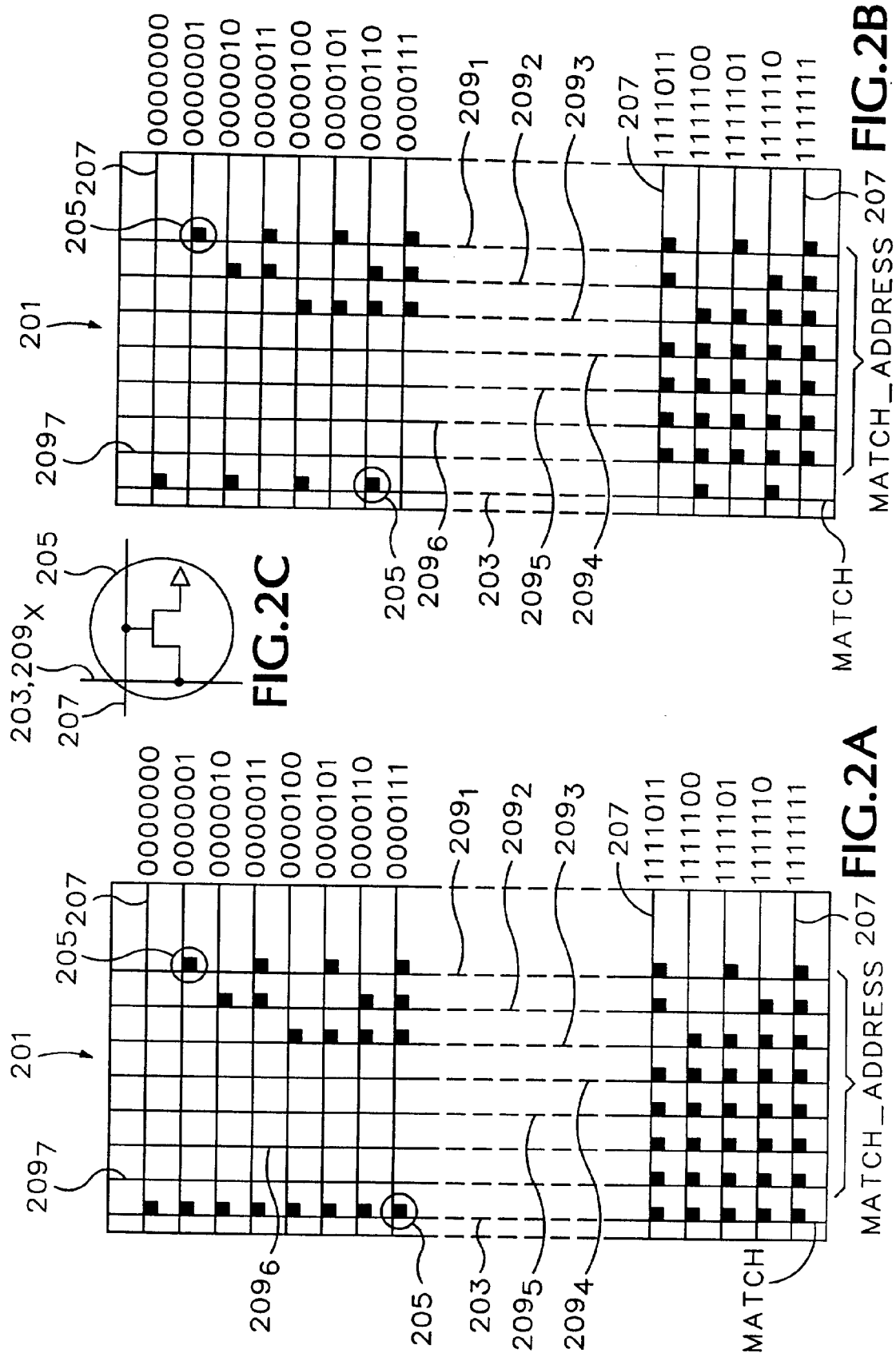

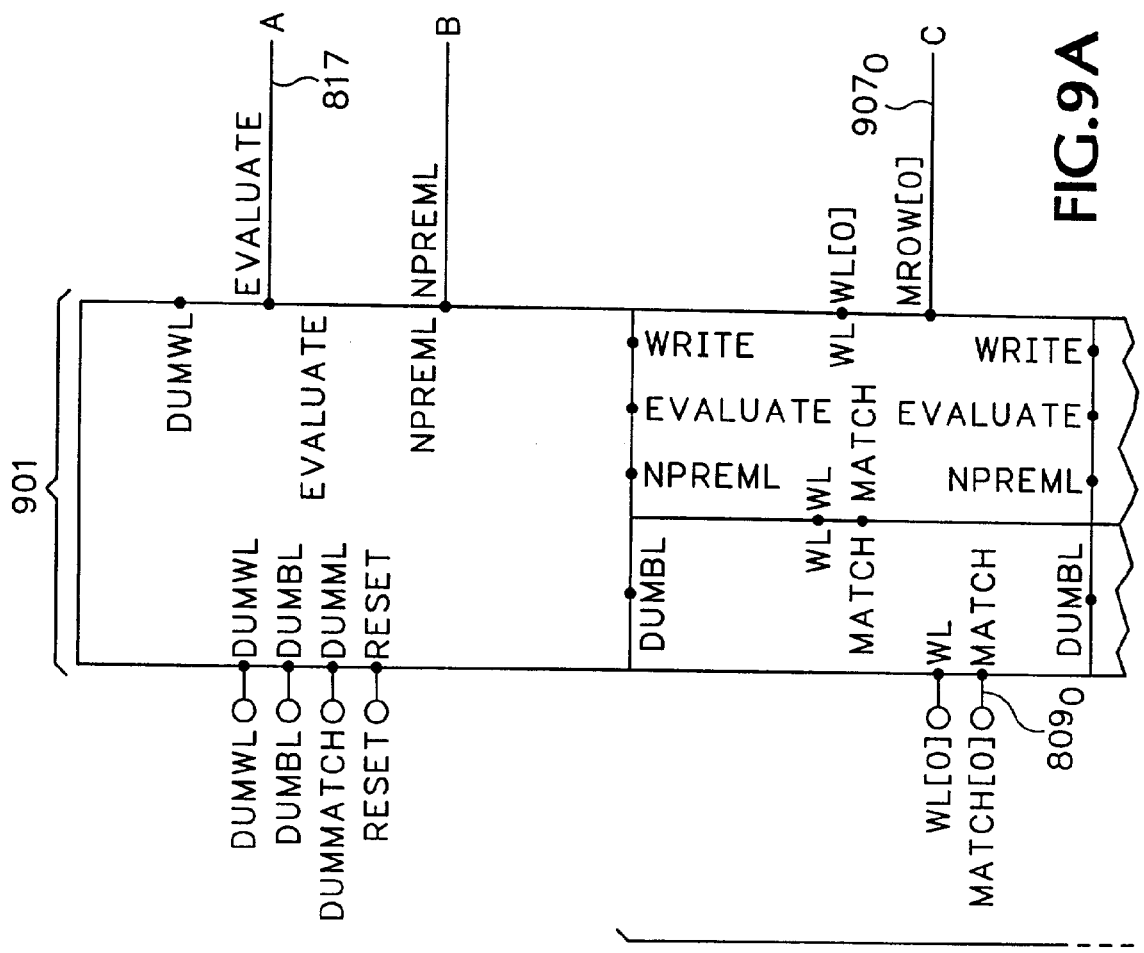
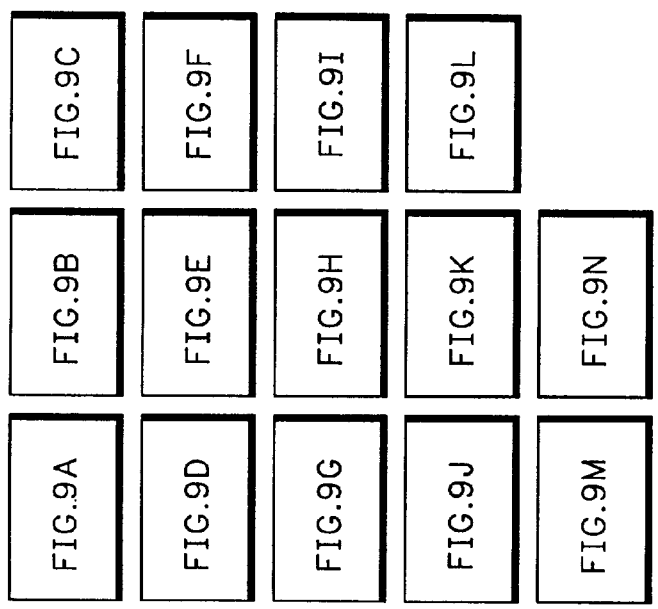

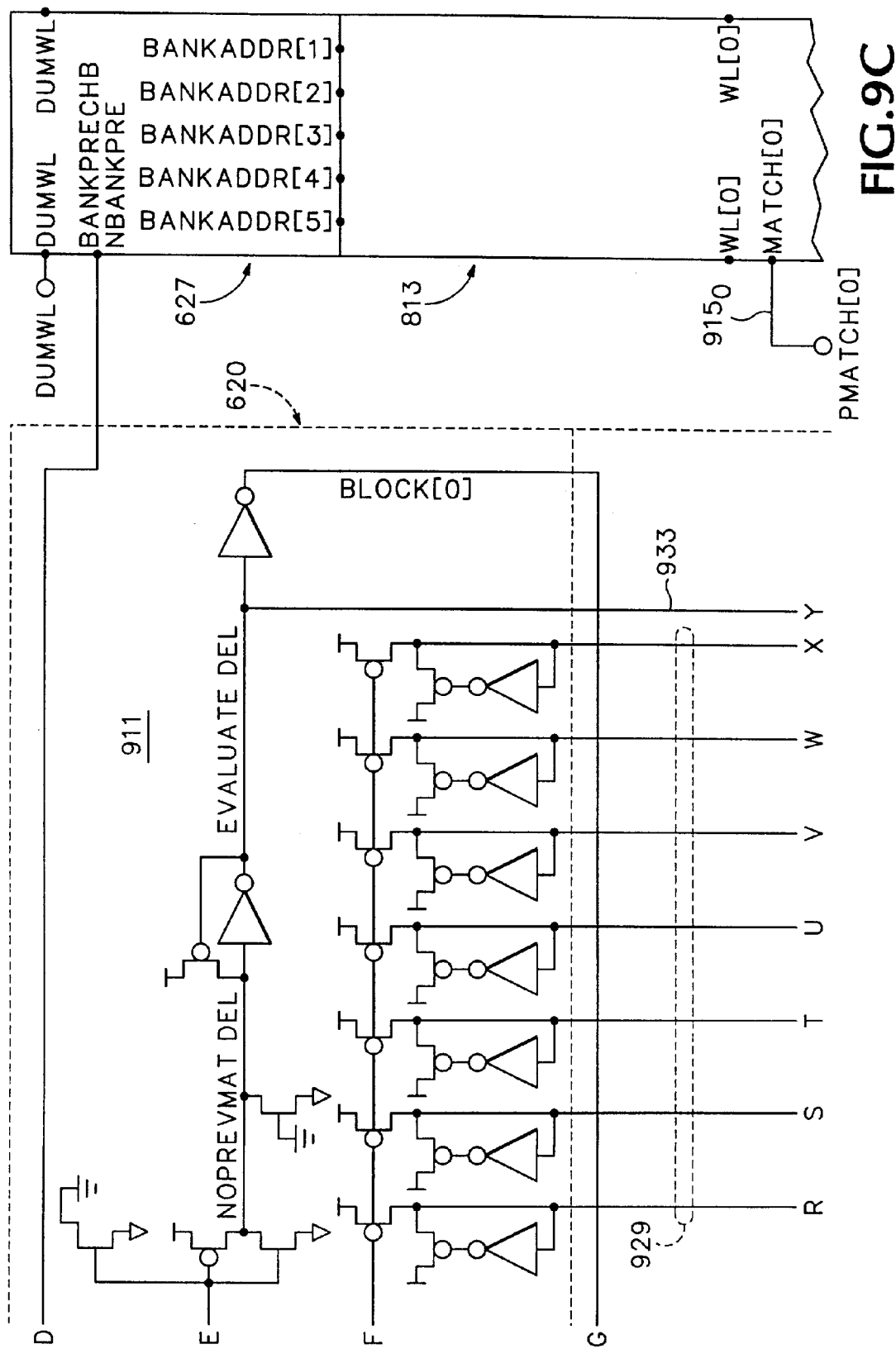

MATCH AND MATCH ADDRESS SIGNAL PRIORITIZATION IN A CONTENT ADDRESSABLE MEMORY ENCODER

RELATED APPLICATIONS

This application is a continuation-in-part of U.S. patent application Ser. No. 08/664,902 now U.S. Pat. No. 5,828,324 filed by Airell R. Clark II on Jun. 17, 1996.

This application is related to U.S. patent application Ser. No. 08/920,935 filed by Airell R. Clark II on this same, Aug. 29, 1997.

BACKGROUND OF THE INVENTION

1. Field of the Invention

The present invention relates generally to the encoding of digital data and, more specifically, to MATCH and MATCH_ADDRESS signal prioritization in a content addressable memory encoder for a system in which more than one match is a possible search routine result.

2. Description of Related Art

Random access memory ("RAM") is perhaps the most common form of integrated circuit memory available in the state of the art. However, RAM devices are not suited for use in systems which process associative data. For example, the well known methodology of sequentially accessing data when addressing the RAM is inefficient for systems involving stored information involving pattern recognition, data compression, natural language recognition, sparse matrix processes, and data-base interrogation. The address associated with the desired stored data may not be known. For this type of data, it is more efficient to interrogate a memory by supplying a compressed subset of the desired data or a code representative of the full data set. The memory responds by indicating either absence of the desired data set or presence of the data set by issuing a match signal and an associated address in the memory bank for the data set.

In the 1980's, another type of memory device was developed to have ambiguous and non-contiguous addressing and was dubbed the content addressable memory ("CAM"). See e.g., U.S. Pat. No. 3,701,980 (Mundy). In essence, for this type of associative data search, the entire CAM can be searched in a single clock cycle, giving it a great advantage over the sequential search technique required when using a RAM device.

As an example, a string dictionary can be stored in a CAM and used in generating Lev-Zempel compressed output data (hereinafter "LZ"; generically used for any LZ data compression technique; see "Compression of Individual Sequences Via Variable-Rate Coding", IEEE Transactions on Information Theory, 24(5):530–536, September 1978, incorporated herein by reference). The input data signal to the CAM would comprise a bit string representation of the data which is being searched for in the CAM. The output would be a signal indicative as to whether the data was found, the MATCH signal, and, if found, the location within the CAM, the MATCH_ADDRESS. Obtaining this MATCH and MATCH_ADDRESS information is done with what is called in the art a "match encoder." As another example, for color hard copy printing a data base may be stored in a CAM where the data consists of bit strings comprising tristimulus space values—cyan, yellow, magenta ("CYM"). U.S. Pat. No. 5,455,576 by Clark II et al. teaches an *Apparatus and Methods for Lempel Ziv Data Compression with Improved Management of Multiple Dictionaries in Content Addressable Memory*, incorporated herein by reference.

The problem with CAM devices is that compared to RAM each individual cell structure is relatively complex. See e.g., U.S. Pat. No. 4,780,845 (Threewitt). Thus, for the same integrated circuit real estate, a CAM device can not match the density, speed, or low-power performance of a RAM device. Integrated circuit process improvements generally affect both types of devices equally, so that in relative terms, CAM architects can not do much to narrow the performance gap.

Perhaps the most critical path through the CAM is the search cycle; that is, the time from receipt of an input data signal, or code, to the encoder input to determine if the CAM has the desired data set to the time of the output of a match or mismatch indication, and, if a MATCH signal is generated, the MATCH_ADDRESS. Depending on the nature of the data, the CAM core memory can contain locations with redundant information; see e.g., U.S. Pat. No. 5,455,576, supra. Therefore, a search will result in a MATCH for more than one MATCH_ADDRESS. When such is the case, there is a need to determine which MATCH_ADDRESS is to be selected, referred to herein as "prioritization."

SUMMARY OF THE INVENTION

In its basic aspects, the present invention provides a method of prioritizing redundant signals of an electronic apparatus having a plurality of output digital bit signals adapted to be combined to form concatenated digital signals composed of plurality of bits specifying a predetermined signal content, and the apparatus having redundant digital signal outputs specifying said predetermined signal content. The method includes the following steps:

dividing the plurality of output digital bit signals into sets, each of the sets adapted to have full signal content of a concatenated digtal signal; and concatenating only first engaged digital bit signals and blocking each subsequent bit signal of each of the sets such that only a first engaged concatenated digital signal is output specifying the predetermined signal content.

In another basic aspect, the present invention provides a content addressable memory (CAM) circuit apparatus having a device for prioritizing memory output. Within a plurality of CAMs, each has a cell array of addressable cell mechanisms for storage of data bits therein, a MATCH signal line connected to each cell, and a plurality of MATCH ADDRESS signal lines. Connected to each of the CAMs to receive each MATCH signal and each MATCH ADDRESS signal therefrom, there are a plurality of circuit mechanisms for prioritizing MATCH signals and MATCH ADDRESS signals such that only a first MATCH signal and a first MATCH ADDRESS signal from a first of the plurality of CAMS are transmitted on an output of the mechanisms for prioritizing. A mechanism is further provided for combining bits of the first MATCH ADDRESS signal indicative of the CAM cell array in the bank providing the first MATCH signal and first MATCH ADDRESS signal and for outputting a MATCH ADDRESS$_F$ signal designating both which the array in the bank provided the MATCH signal and an address within the array.

In still another basic aspect, the present invention provides a content addressable memory (CAM) system with a priority encoder apparatus. The system includes:

a plurality of CAM cores, each containing data such that redundant MATCH signals and MATCH ADDRESS signals can be output therefrom on output bit lines thereof;

a plurality of priority encoders connected to receive each the MATCH signal and MATCH ADDRESS signals from one of the plurality of CAM cores, respectively, each of the priority encoders having an input signal buffer connected to each output bit line of one of the plurality of CAM cores, respectively, to receive MATCH signal bits and MATCH ADDRESS signal bits, a plurality of priority encoding circuit means, divided into $N^2$ sets, where $N^2$=the number of MATCH ADDRESS signals inputs from each CAM core, for encoding MATCH signal bits and MATCH ADDRESS signal bits and for blocking MATCH signal bits and MATCH ADDRESS signal bits of subsequent to first active MATCH signal bits and first active MATCH ADDRESS signal bits in each set; and an address encoder for receiving MATCH signal bits, MATCH ADDRESS signal bits, blocked MATCH signal bits, and blocked MATCH ADDRESS signal bits such that only first active MATCH signal bits and first active MATCH ADDRESS signal bits are concatenated, providing only a first MATCH output signal and first MATCH ADDRESS output signal from the system.

It is an advantage of the present invention that it resolves contentions in a CAM search where more than one match may occur.

It is an advantage of the present invention that it improves the speed of a CAM search cycle without the need for integrated circuit fabrication process improvements.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIGS. 2A, 2B, 2C are comparison schematic diagrams of detail for CAM core encoders as shown in FIG. 1 in which:

FIG. 2A represents a traditional encoder design,

FIG. 2B represents a encoder in accordance with the present invention, and

FIG. 2C shows a detail of FIGS. 2A and 2B.

FIGS. 3A and 3B and FIGS. 4A and 4B are comparison schematic diagrams of final encoders as shown in FIG. 1 in which:

FIGS. 3A–3B represent a traditional final encoder design, and

FIGS. 4A–4B represent a final encoder in accordance with the present invention as shown in FIG. 1.

FIGS. 9 is a diagram map for FIGS. 9A–9N, in which:

FIGS. 9A–9N are a circuit diagram of prioritization encoder stages of the present invention as shown in FIG. 8.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventor for practicing the invention. Alternative embodiments are also briefly described as applicable. Sectional subtitles are provided hereinafter for convenience and are not intended to express any limitation on details described thereunder, nor should any such limitation be implied.

Match and Match Address Signal Generation

Figure 1:
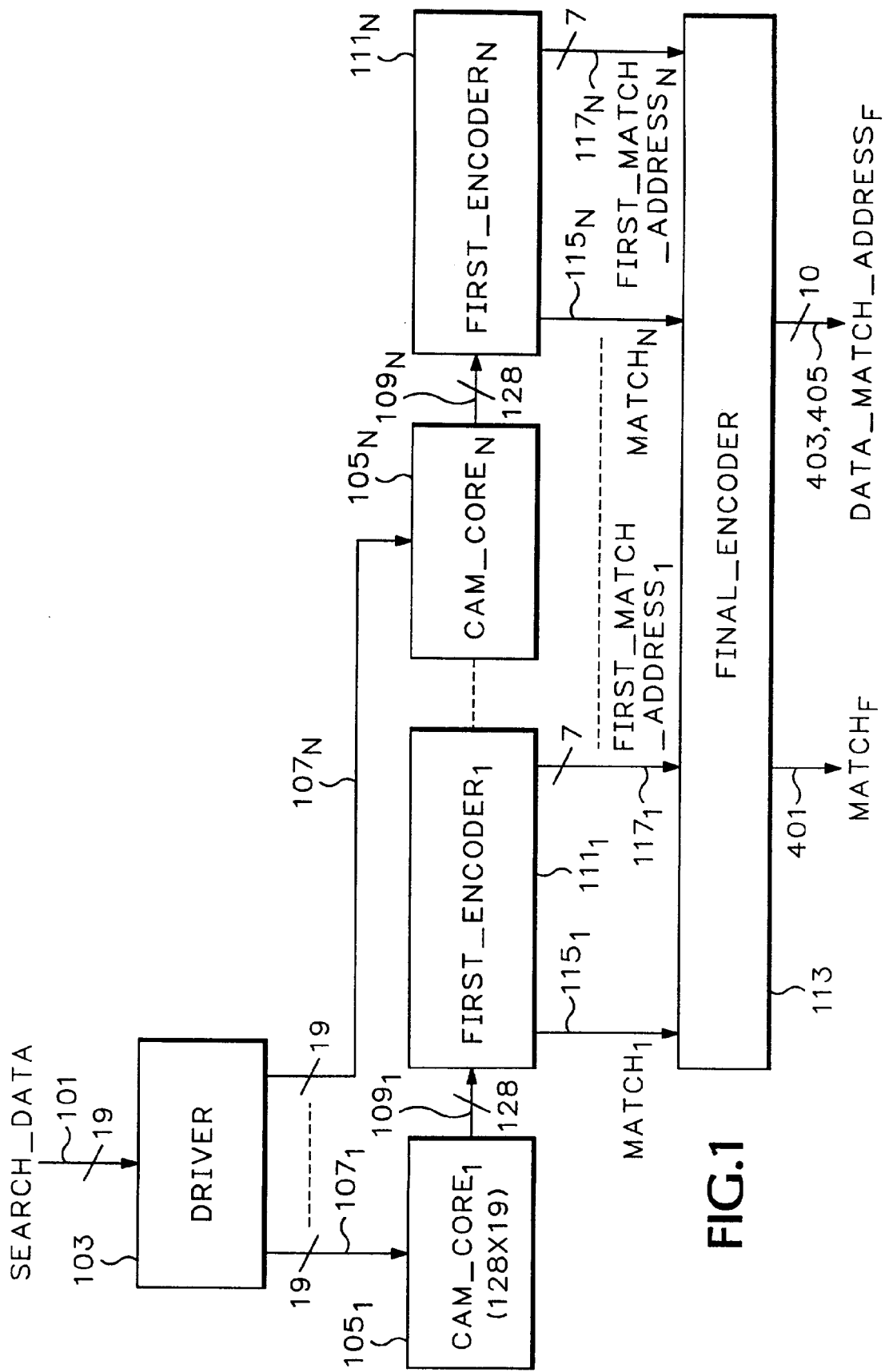
FIG. 1 is a schematic block diagram of a CAM system incorporating the invention as detailed in the parent application, Ser. No. 08/664,902, described also herein in pertinent parts.

Turning now to FIG. 1, SEARCH_DATA on standard bus 101 is fed from the search engine (e.g., a central processing unit (not shown)) through a driver 103, comprising standard buffering hardware as would be known in the art to drive relatively the high capacitance of cam core cell architecture.

Each CAM_CORE $105_1$–$105_N$ comprises an array of standard transistor-based cell circuitry and search circuitry as would also be known to a person skilled in the art. Each cell of the array stores one bit. In accordance with the exemplary embodiment, a total CAM of 768_words by 19_bits is described. It is assumed for the exemplary embodiment that due to integrated circuit layout constraints, that N=6; that is, six CAM_CORES $105_1$–$105_6$ of 128_ words by 19_bits each is provided. There is no express intent to limit the applicability of the present invention to the exemplary embodiment nor should any such limitation be implied; the scope of the invention is defined by the claims set forth hereinafter.

Figure 3A:
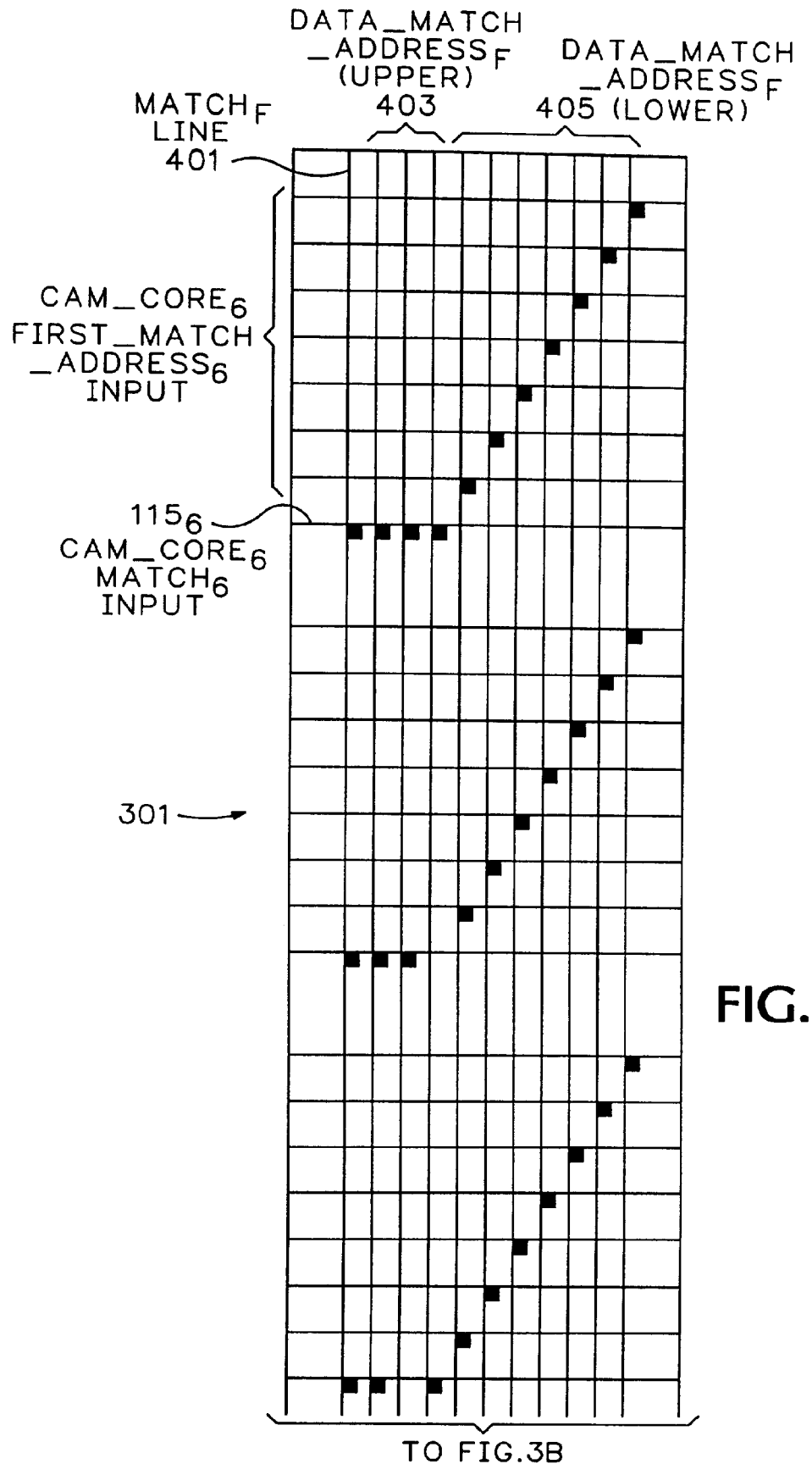
Figure 3B:
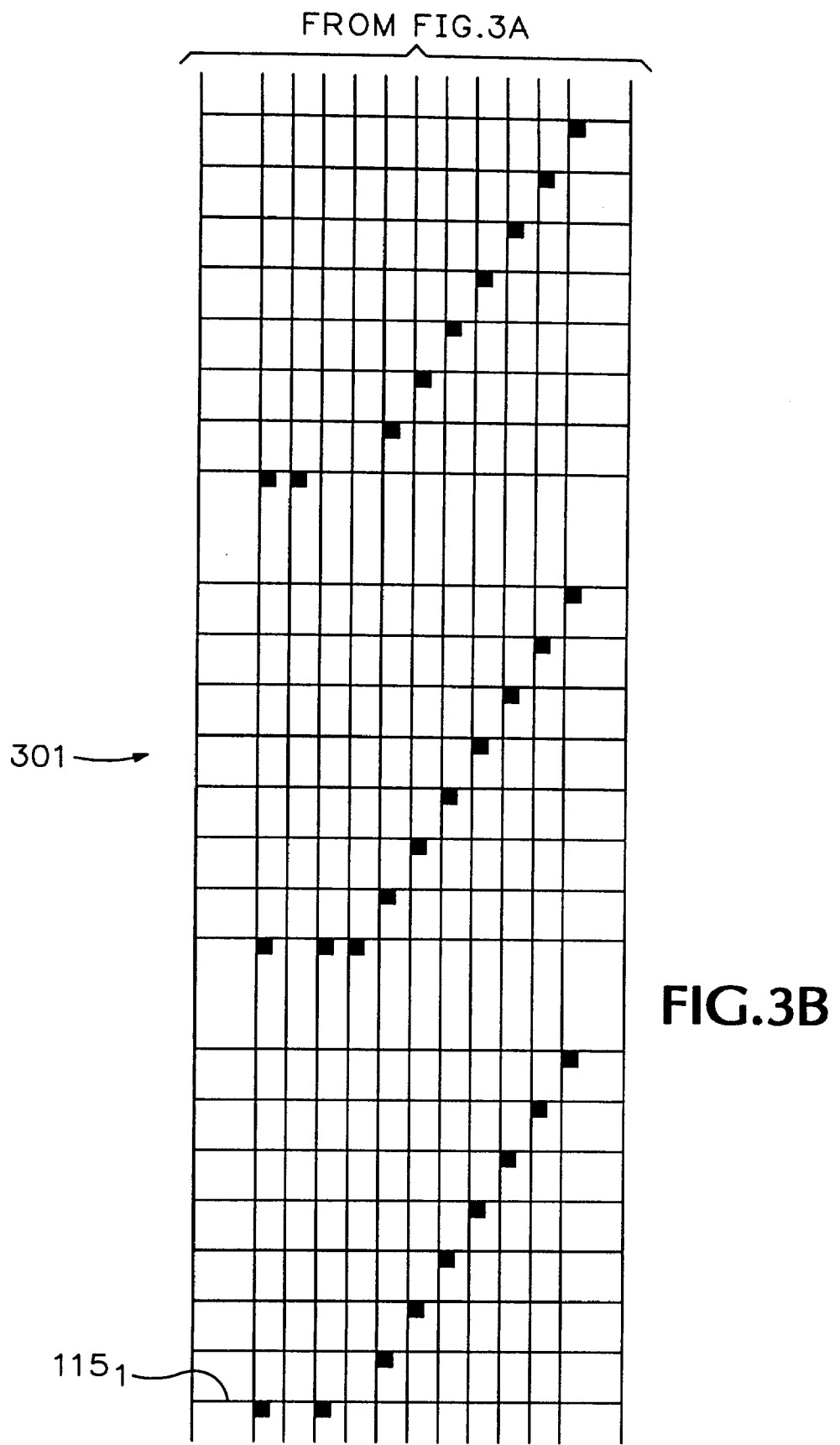
Figure 4A:
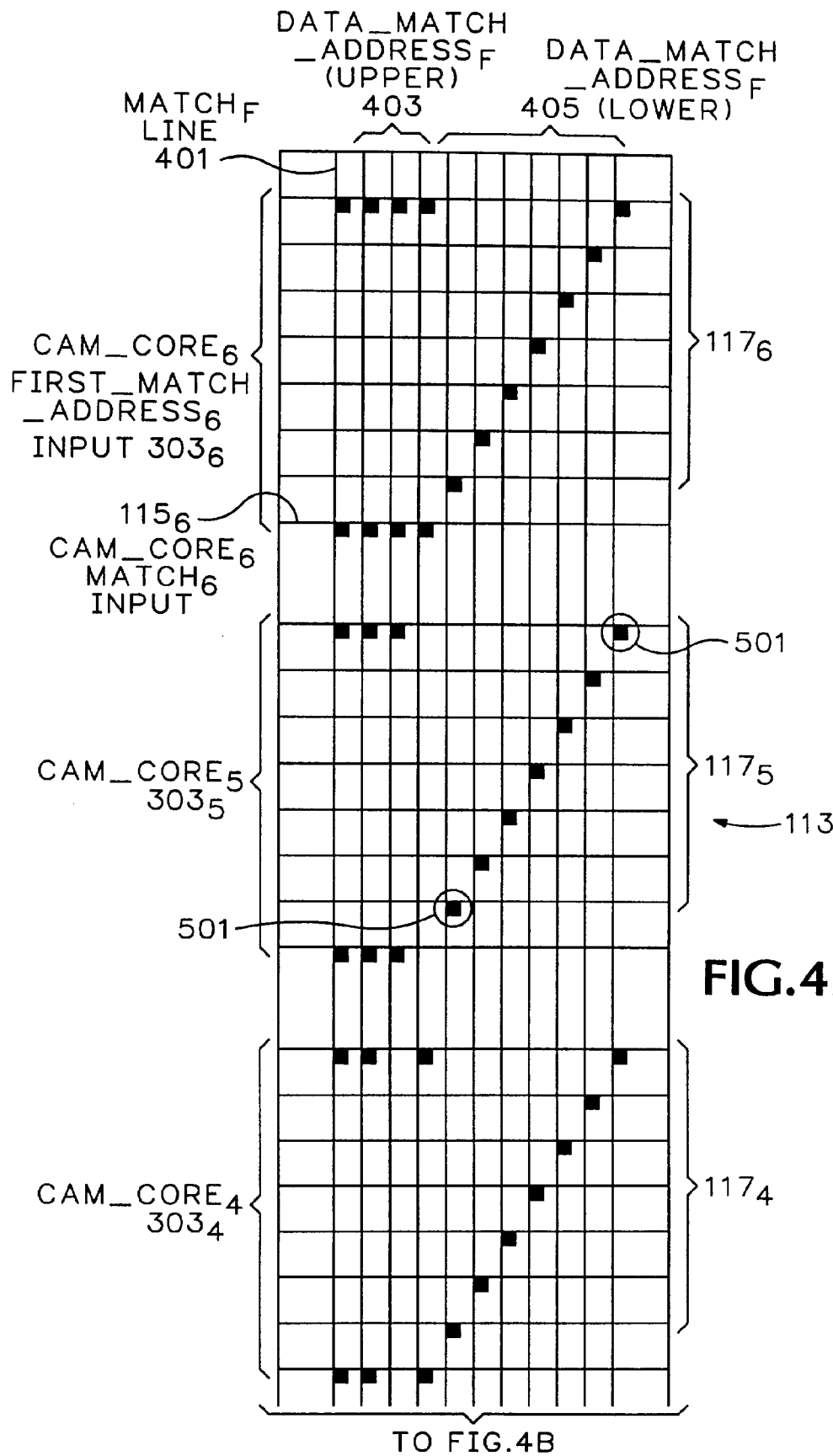
Figure 4B:
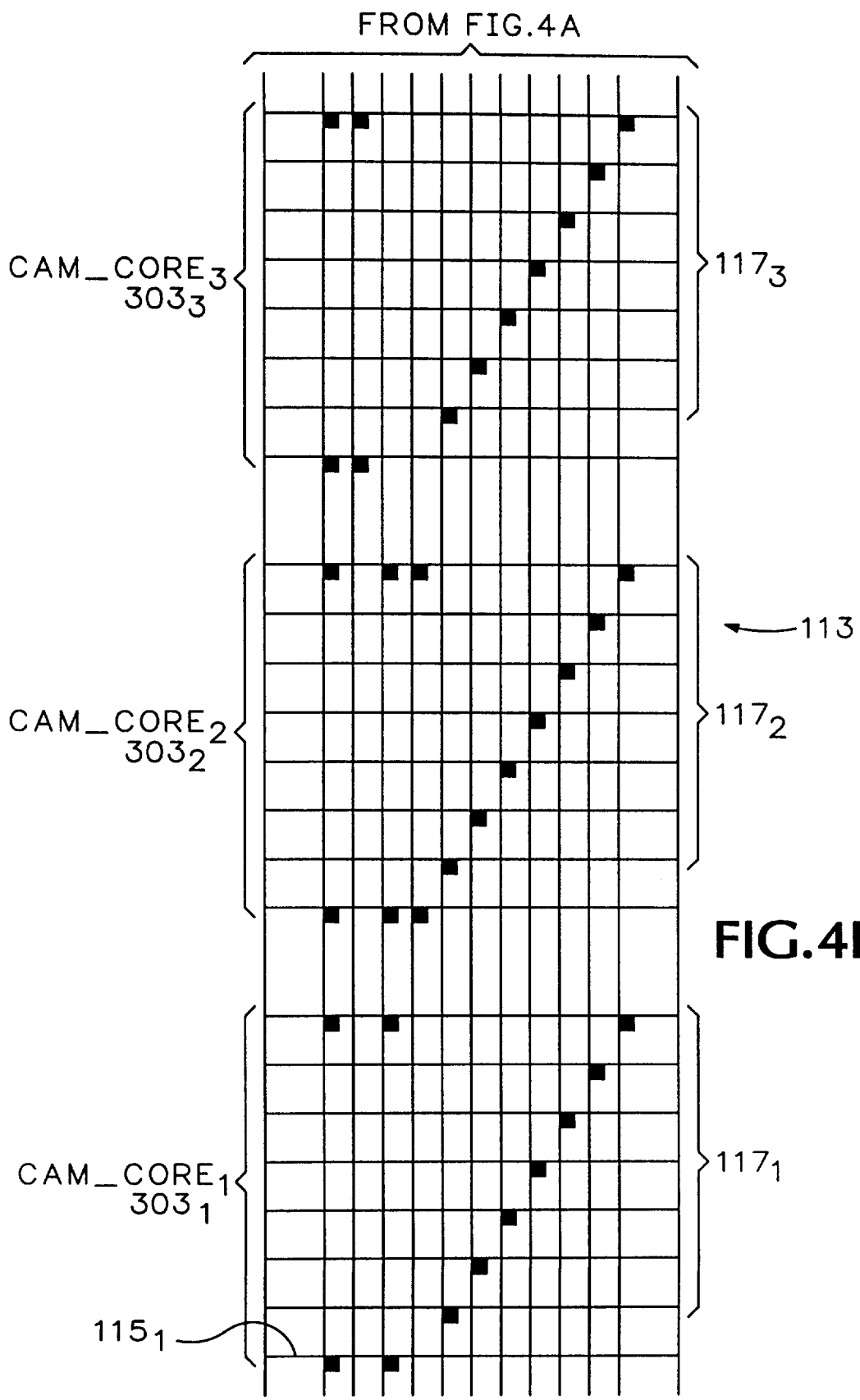

The SEARCH_DATA is input through standard buses $107_1$–$107_N$ to interrogate each CAM_CORE $105_1$–$105_N$. While for implementation for certain algorithms more than one CAM_CORE $105_1$–$105_N$ could have a MATCH, it is assumed in this exemplary embodiment implementation that only one cell on one CAM_CORE $105_1$–$105_N$ contains the data set of interest. Thus, if any, there will be only one $MATCH_x$ signal and one corresponding FIRST_MATCH_ $ADDRESS_x$. [An embodiment for prioritization of multiple matches is set forth hereinafter with respect to FIG. 3.]

In general it is known to precharge the CAM_CORE outputs such that post-search transitions are recognized as the MATCH and MATCH_ADDRESS signals. In this example, the outputs are precharged to all HIGH. Each CAM_CORE $105_1$–$105_N$ has an output bus $109_1 109_N$ with one line for each of the stored data words, viz. 128_words in the exemplary embodiment. If a mismatch occurs for any location, the output bit for that location is pulled to LOW to indicate a MISMATCH; thus, if an output stays HIGH, it indicates a MATCH. If there is no match, all outputs go LOW. Thus, for each CAM_CORE $105_1$–$105_n$, one hundred and twenty eight outputs on respective buses $109_1$–$109_N$ tell whether a particular address in that cell array is a MATCH or a MISMATCH. The output signal derivation for each CAM_CORE output of the six device memory bank is accomplished using a memory FIRST_ENCODER $111_1$–$111_N$.

The one hundred and twenty eight outputs of the six CAM_CORES $105_1$–$105_6$ now need to be turned into a final match signal, MATCH_SIGNAL$_F$, and DATA_MATCH_ADDRESS$_F$ signal, preferably in one clock cycle, where DATA_MATCH_ADDRESS$_F$ is both the address of a particular CAM_CORE $105_x$ and its cell array address, FIRST_MATCH_ADDRESS$_x$. Assuming again only one MATCH designation for one CORE_CORE $105_1$–$105_N$ of the memory bank, CAM_CORE$_1$ $105_1$ through CAM_CORE$_N$ $105_N$, a MATCH$_F$ signal and an appropriate DATA_MATCH_ADDRESS$_F$ is derived using FINAL ENCODER 113. A final encoder is shown in assignee's U.S. Pat. No. 5,373,290 as part of element 194, FIGS. 5A, 5B. In element 194, a final encoder 301 for an array of six cam_cores has six sections, one designated for each cam_core of the array. Reference can also be made to the parent application, FIGS. 3A, 3B and 4A, 4B of U.S. patent application Ser. No. 08/664,902 filed by Airell R. Clark II on Jun. 17, 1996, as repeated here.

Turning now to FIGS. 2A and 2B, a standard CAM encoder 201, FIG. 2A, is shown. Such an encoder 201 is used in a CAM system such as shown in the assignee's U.S. Pat. No. 5,373,290 (Lempel et al.) as element 194, FIG. 5, explained beginning in column 12, line 28 et seq., incorporated herein by reference in its entirety. In the encoder 201, a MATCH line 203 has a pull down transistor 205, configured as in FIG. 2C, one for each of the one hundred and twenty eight data words in each CAM_CORE $105_1$–$105_N$. Likewise, one hundred and twenty eight CORE_MATCH lines $207_{0000000}$ (location zero) through $207_{1111111}$ (location 127) are multiplexed to the MATCH line 203, from a least significant bit ("LSB") MATCH_ADDRESS line $209_1$ through a most significant bit ("MSB) MATCH_ADDRESS line $209_7$, in essence a multiplex wired OR configuration [note: as will be described hereinafter, seven bits will also form the lower address bits of a ten bit address from the FINAL ENCODER 113, FIG. 1]. Thus, the MATCH line 203 has one hundred and twenty eight pull down transistors 205 (counted vertically in FIG. 2A), but each of the MATCH_ADDRESS lines $209_1$–$209_7$ has only sixty four pull down transistors.

Comparing this embodiment of the standard CAM encoder 201 in FIG. 2A to the FIRST_ENCODER 201 in accordance with the present invention as shown in FIG. 2B, the difference lies in that on MATCH line 203, pull down transistors 205 are provided only for one half of CORE_MATCH lines $207_{0000000}$ (location zero) through $207_{1111110}$ (location 126). For locations having no MATCH line 203 pull down transistors 205, a designated pull down transistor of the MATCH_ADDRESS lines $209_1$–$209_7$ are used to serve double duty, that is, also indicating a match condition when switched.

For example, as shown where every other MATCH line 203 has a pull down transistor 205, if the DATA of interest of the SEARCH_DATA is at location 0000011, a location having no MATCH line 203 pull down transistor 205 but using bit_0 to do the double duty, since only one location of the CAM_CORE is ever a match, no conflicts will occur. That is, if the CAM_CORE has set the MATCH_ADDRESS at location 0000011, bit_0 has change state, indicating a MATCH. As another example, if the most significant MATCH_ADDRESS bit is used for the double duty, only the top sixty-four MATCH lines 203 require pull down transistors 205. Thus, use of one of the MATCH_ADDRESS bits as also indicating a MATCH when a true match has occurred in this manner reduces the number of pull down transistors on the MATCH line 203 to sixty-four. As a result, the MATCH line 203 will be as fast as the MATCH_ADDRESS lines 209.

In a commercial implementation having a search access time of approximately 6 nanoseconds, an improvement of approximately 0.5 nanosecond has been found to be achieved.

Recall that the present exemplary embodiment as shown in FIG. 1 uses a bank of six CAM_CORES $105_{1-6}$, each with its own FIRST_ENCODER $111_{1-6}$. Now each of the output signals MATCH$_{1-6}$ on each FIRST_ENCODER_MATCH output bus $115_{1-6}$ and its appurtenant FIRST_MATCH_ADDRESS output bus $117_{1-6}$ needs to be encoded in order to obtain both a final MATCH$_F$ signal back to the CPU, indicating the data of interest has been found, and a DATA_MATCH_ADDRESS$_F$ specifying both the FIRST_MATCH_ADDRESS on bus $117_x$, where x=the CAM_CORE$_{0-127}$ location which generated a MATCH signal, and a designation of which of the six CAM_CORES $105_{1-6}$ generated a MATCH signal. This function is accomplished in the FINAL ENCODER 113 by adding three upper address bits to the seven FIRST_MATCH_ADDRESS bits for the CAM_CORE 105 location where the full data of interest resides.

Turning to FIGS. 3A–3B and 4A–4B, a FINAL ENCODER 113 for accomplishing this task is provided.

FIG. 3A again refers to an embodiment as shown in assignee's U.S. Pat. No. 5,373,290 as part of element 194, FIG. 5. In element 194, a final encoder 301 for an array of six cam_cores has six sections, one designated for each cam_core of the array. As stated earlier, each FIRST_ENCODER $111_{1-N}$, FIG. 1, has an output line $115_{1-N}$ for a MATCH$_{1-N}$ signal and an output bus $117_{1-N}$ for a FIRST_MATCH_ADDRESS$_{1-N}$. Looking to both FIGS. 3A–3B and 4A–4B for comparison, and focusing on the section of FINAL ENCODER 113, FIG. 1, for CAM_CORE$_6$ as an example of each section, the MATCH$_6$ signal on line $115_6$ provides an appropriate HIGH or LOW state signal to each respective FINAL ENCODER 113 input subsection, CAM_CORE$_{1-N}$, $303_{1-N}$. Each FIRST_MATCH_ADDRESS 7-bit bus $117_{1-N}$ is likewise input to each FINAL ENCODER 113 input subsection, CAM_CORE$_{1-N}$. That is to say, each CAM_CORE$_x$ has its respective FIRST_ENCODER $111_x$ output connected to a respective subsection of the FINAL ENCODER 113 which will in turn provide the actual MATCH$_F$ signal and DATA_MATCH_ADDRESS$_F$ for the data of interest based on the SEARCH_DATA input.

Figure 5A:
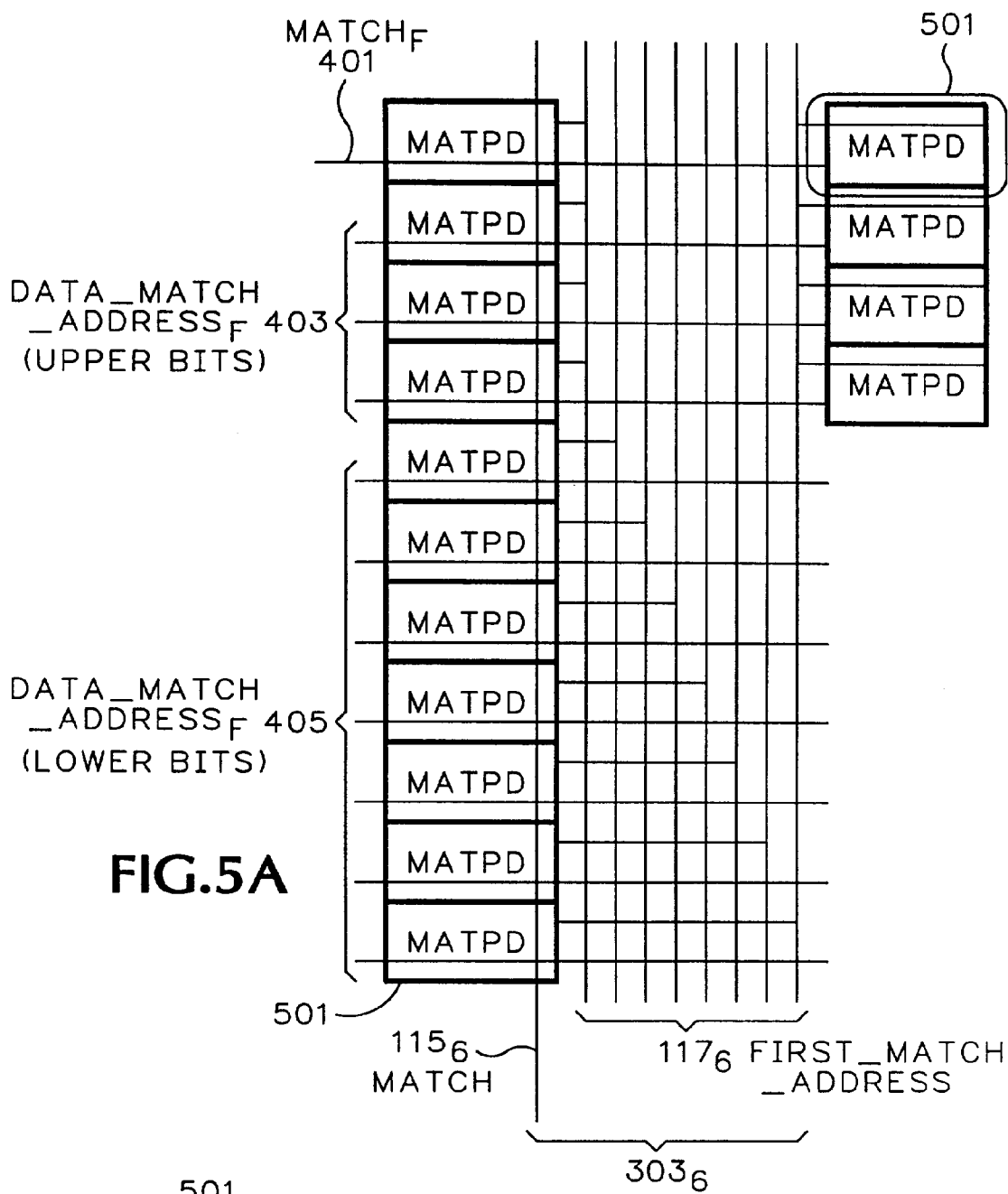
FIG. 5A is a detailed schematic of one final encoder subsection for a $CAM\_CORE_x$ as shown in FIG. 4B.
Figure 5B:
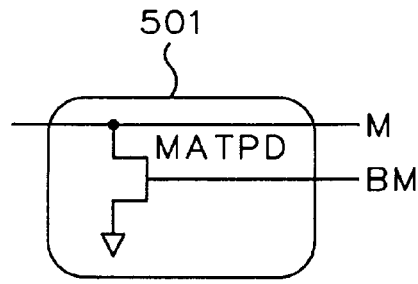
FIG. 5B is a detail of FIG. 5A.

Looking also to FIGS. 5A and 5B, detail for FINAL ENCODER 113 subsection CAM_CORE$_6$ $303_6$ is depicted. The FINAL ENCODER 113 is multiplexed with the inputs 115, 117 from the FIRST_ENCODER$_x$. Match signal pull down transistors 501 are provided in a manner such that when a MATCH$_6$ and FIRST_MATCH_ADDRESS$_6$ is received from a FIRST_ENCODER$_6$, the FINAL ENCODER input subsection CAM_CORE$_6$ will provide both a MATCH$_F$ signal on FINAL_MATCH_LINE 401 and an expanded, 10-bit address for the data, DATA_MATCH_ADDRESS$_F$. In the example, the DATA_MATCH ADDRESS designates the CAM_CORE$_6$ in its added upper three bits on DATA_MATCH_ADDRESS$_F$ upper bit lines $403_{1-3}$, and pass through the FIRST_MATCH_ADDRESS$_6$ on DATA_MATCH_ADDRESS$_F$ lower bit lines $405_{1-7}$ (with reversal of all signal levels, HIGH to LOW and LOW to HIGH if necessary to use standard logic where HIGH=1).

Returning to FIGS. 3A–3B and 4A–4B, each CAM_CORE$_x$ can be compared and it can be seen that the removal of half of the pull down transistors 205 on FIRST_ENCODER_MATCH lines 207 in FIG. 2B for providing the MATCH$_X$ signal has been added back in the FINAL ENCODER 113 on MATCH$_F$ lines 401. However, it has been found that this arrangement in the critical path in the present invention as shown in FIGS. 2B, 4A–4B, and 5A–5B provides an improvement of in reducing the cycle time approximate ten percent over the arrangement of FIGS. 2A, 3A–3B in a synergistic manner.

Self-timed Precharging

A self-timed system, is described in detail co-pending application Ser. No. 08/920,935, incorporated herein by reference in its entirety, having a CAM_CORE device 200 and PRIORITY_ENCODER 611 in accordance with related inventive concepts. Relevant portions are repeated here.

For some implementations the assumption that only one matching data set will be found is not true. Prioritization—selection of one of a possible plurality of the matching data sets—must be accomplished to prevent an unresolved contention and logic error. A priority encoder for the situation where there may be more than one match and match address follows, e.g., in a data compression implementation where multiple compression dictionaries are employed is shown in FIG. 8, where elements $811_0$–$811_N$ are analogous to element 611 for the purpose of explaining the invention in terms of a particular exemplary embodiment.

Generally speaking, since the memory output, for example, of a set of data compressions dictionaries stored in the CAM_CORES $105_0$–$105_N$, is deterministic, more than one core location can contain the data sought at a given time. As an example of use, assume there are two actual CAM devices, one holding data compression string information and the second holding status information, telling status of a particular dictionary, e.g., 00=previous dictionary, 01=current dictionary, 10=standby dictionary, 11=invalid. There is a one to one relationship between the string CAM and the status CAM. Status information tells which of the multiple dictionaries the information is actually in. (See e.g., U.S. Pat. No. 5,455,576, elements 40 and 28). The possibility of multiple matching entries in such a system is a distinct possibility.

Figure 8:
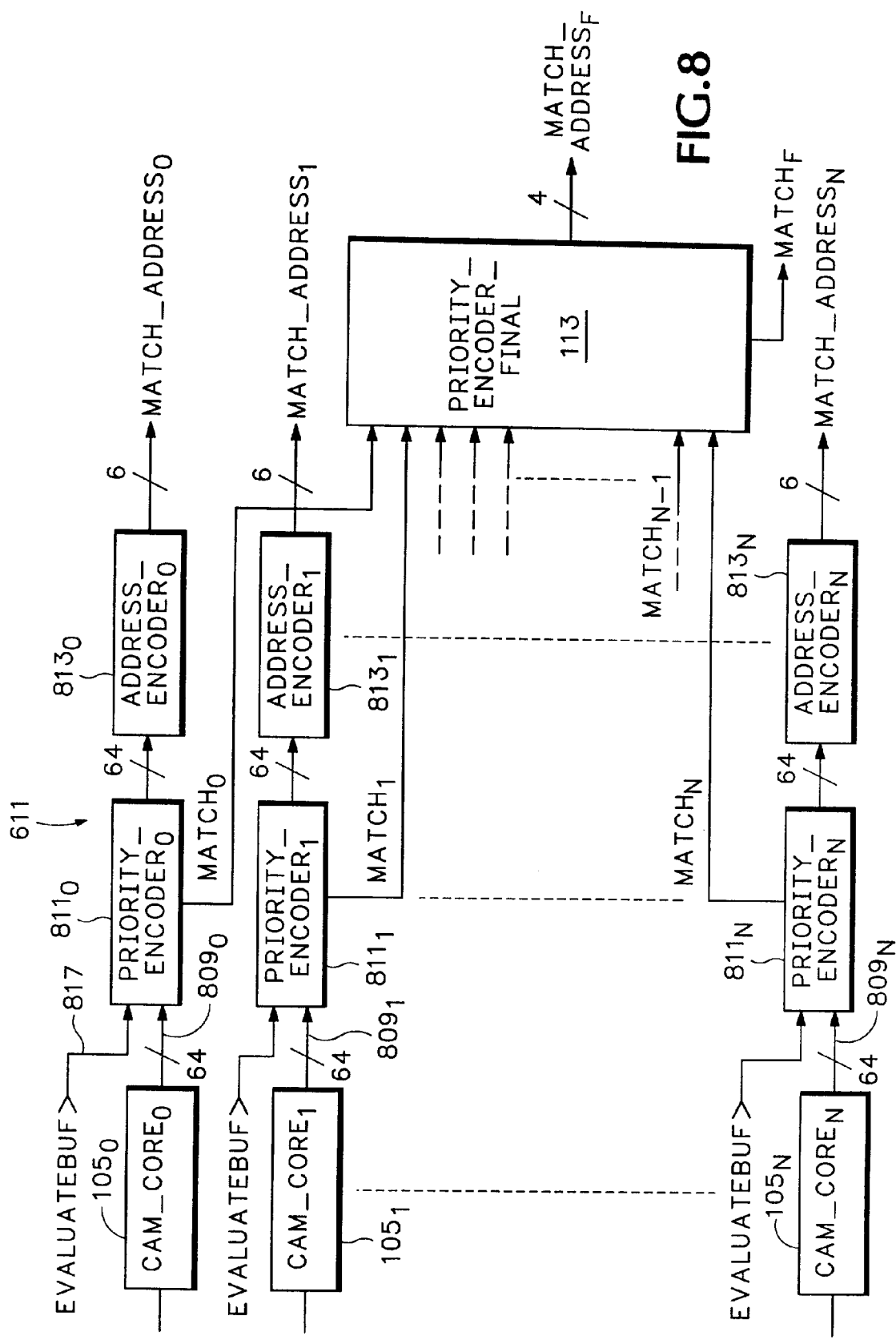
FIG. 8 is a detailed schematic block diagram of components of a subsystem in an alternative embodiment to the system as shown in FIG. 1 in accordance with the present invention.

While the CAM_CORES $105_0$–$105_N$ of CAM_CORE device 200 are shown in FIG. 8 as discrete devices, it will be recognized by a person skilled in the art that generally one memory cell array is used and for the purpose of the present invention is subdivided. For this example, let N=11, 768 inputs divided into twelve segments of 64. The present invention serves the function to provide both the MATCH signal and a 10-bit MATCH_ADDRESS signal to select the first location having the data sought. It will be recognized by those skilled in the art that this is a design expedient for purpose of describing the present invention and modifications can be made to develop other selection criteria for a different implementation; for example, for 1024 entries N=16 and circuitry expansion to develop a 10-bit MATCH_ADDRESS is required; that is the circuit sections are in a power of two, $2^n$, e.g., $2^{10}$=1024.

Signal convention hereinafter uses "N_"0 to indicate active low logic signals, "P_" for prioritized signals.

When the CAM_CORES $105_N$ have their respective 64-bit output bus lines $809_0$–$809_N$ (analogous to FIG. 1, elements $109_x$) set to output SEARCH_DATA results, and the EVALUATEBUF enable signal is set, priority encoding commences. Each CAM_CORE section has a possibility of one or more of its 64-match lines of the each bus line $809_{0-63}$ indicating either a HIGH if there is a MATCH at the connected location or a LOW if there is no match for that location.

The goal is to have the prioritizer circuit including PRIORITY_ENCODER $811_X$ and ADDRESS_ENCODER $813_x$ (analogous to FIG. 1, elements $111_X$) provide a MATCH and a MATCH_ADDRESS to only the first location where the data is to be found in a CAM_CORE $105_n$. MATCH signals appear in time relatively quickly following an EVALUATEBUF signal (see, e.g., and compare FIG. 6, FIG. 7, waveforms circle-6 and circle-12, and FIG. 8 on line 817), whereas the MATCH_ADDRESS signals take longer to establish and output. By dividing the encoding functionality as follows, by the time six lower bits of a MATCH_ADDRESS are available, four upper bits are also generated such that the MATCH_ADDRESS provided is to the first location word lines of the first CAM_CORE of the bank having the required data. A FINAL_ENCODING 113' can be provided as explained heretofore.

Figure 6:
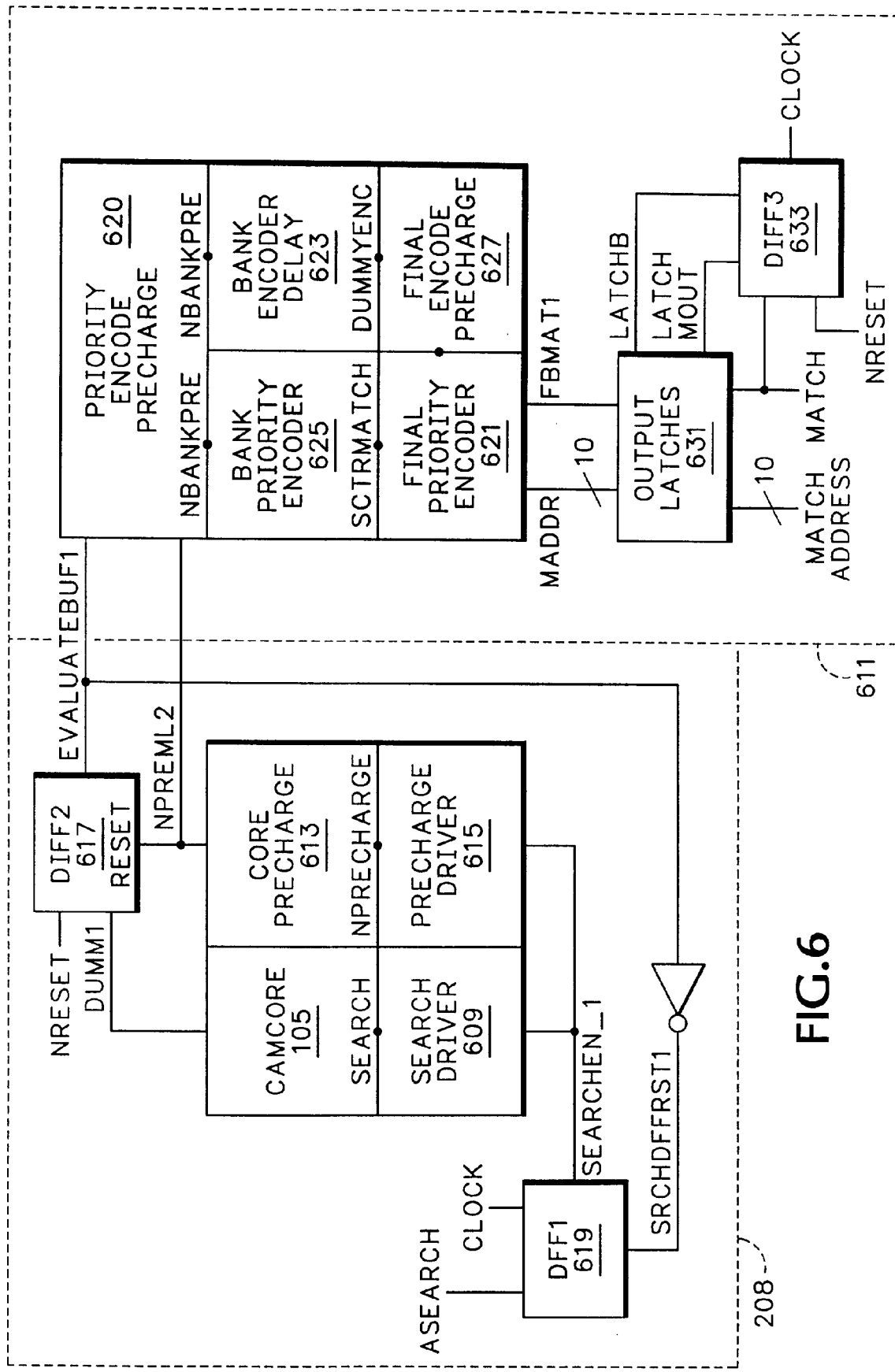
FIG. 6 is a schematic block diagram of a section of a CAM system incorporating the present invention.

Turning to FIG. 6, a preferred embodiment is shown of details of a CAM_CORE device 200 and ENCODER 611 device, block diagram, system architecture in accordance with the present invention.

Figure 7:
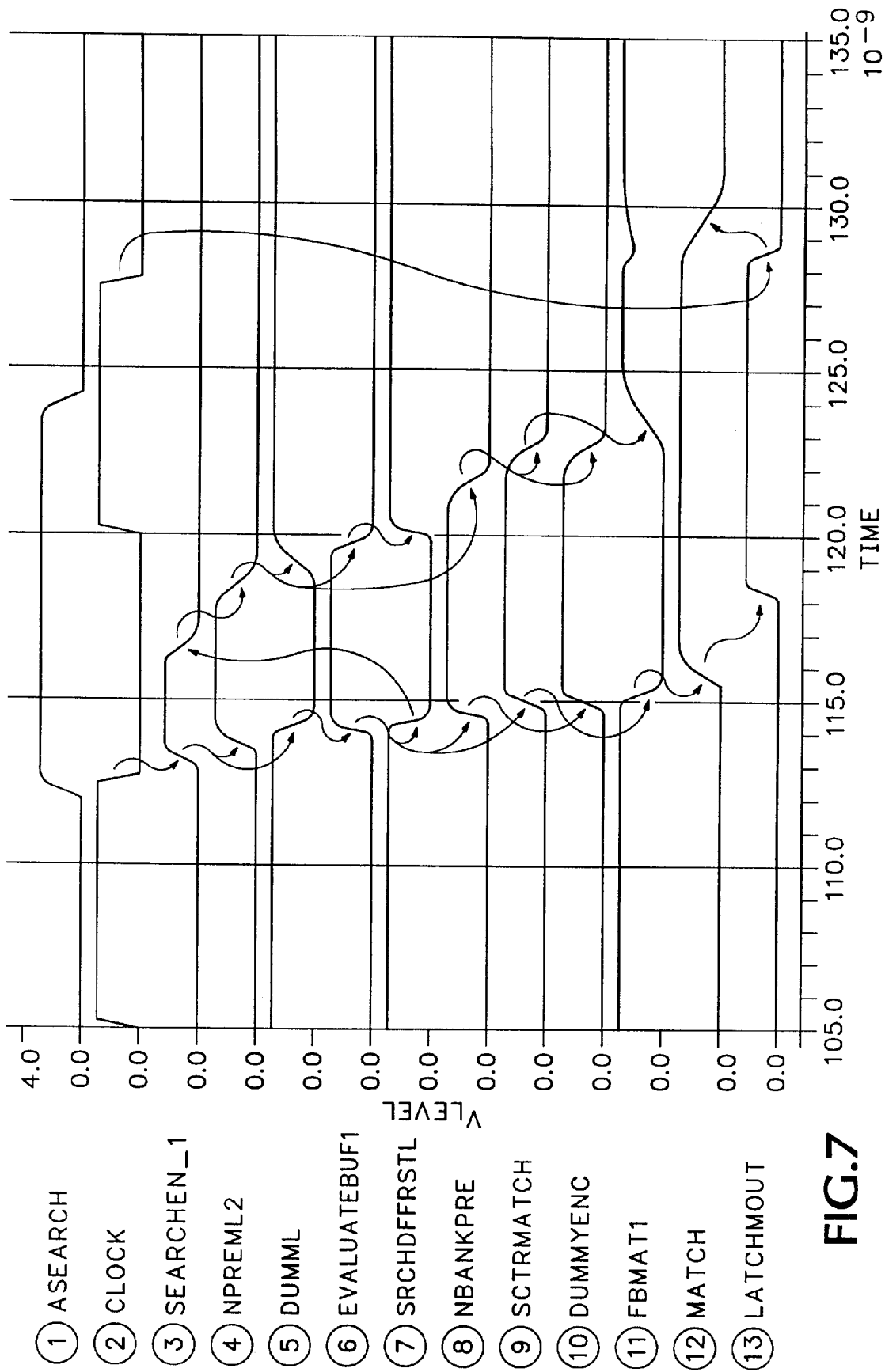
FIG. 7 depicts timing waveform diagrams for the present invention as shown in FIG. 6.

A signal timing diagram for the system architecture is shown in FIG. 7. While actual timing in a specific implementation will vary, and while actual signal occurrence timing will vary with fabrication process, voltage, and temperature ("PVT") fluctuations, relative signal occurrence timing is substantially constant as shown for the exemplary embodiment described throughout.

Referring to both FIGS. 6 and 7, waveform-2, the system is exemplified by a 15-nanosecond ("ns") system clock cycle. Assume that the chip logic output is a CAM search request, ASEARCH, waveform-1, having a rising edge occurring at t=112+. A next CAMCORE search is enabled, SEARCHEN_1, waveform-3, issued at the falling edge of the CLOCK signal, t=112.5. Assume further that the system is timed for a search of the CAM array to be accomplished in about 3.0 ns, and SEARCHEN_1 goes LOW, as explained hereinafter. During the remainder of the clock cycle, 12 ns, time must be budgeted for the CAM output and for the setting up for the next system clock cycle repeat, starting at t=127.5, where, absent the present invention, the next precharge can also be triggered. Thus, with only the clock transitions as triggers, CAM precharge would have to wait until the start of each new cycle. Depending upon the CAMCORE size, system speed, and clock cycle budgeting for a specific implementation, there might not be enough time in such a budget to precharge the CAMCORE in this manner. However, if the CAM search time can be shortened and precharge can be initiated as soon as the actual search of the CAMCORE 207 ends, a greater precharge time can be made available in which to schedule and accomplish precharging.

An advantage to having a longer precharge time is that where only one transition of a cell gate of the CAMCORE is necessary during the clock cycle—viz., to indicate a match—the cells can be designed as unbalanced, i.e., to change more quickly in one direction. For example, a NAND gate that goes HIGH to LOW in 0.2 ns during the search and LOW to HIGH in 2.0 ns during precharge is acceptable when enough precharge time can be scheduled. Whereas a balanced gate might take 0.4 ns in each direction, by unbalancing the gate, the speed through the gate is thus doubled. Maximizing the precharge time allows a maximal unbalance factor in the gates, thereby maximizing search speed.

Returning to FIGS. 6 and 7, as CLOCK goes LOW, SEARCHEN_1 goes HIGH, t=113.0. This enables the SEARCH DRIVERS 609 and disables the CORE PRECHARGE circuitry 613, 615, NPRECHARGE going HIGH [Note that a signal name starting with N_, symbolizes an active LOW signal]. The CAMCORE precharge signal, NPREML2, waveform-4, goes HIGH, t=113.5, turning the core precharge off, and DUMM1, waveform-5, goes LOW, t=114.0. The search signals thus pass through the CAMCORE 105 to block an edge-triggered, set-reset, flip-flop DFF2 617 which drives EVALUATEBUF1, waveform-6, HIGH, t=115–. DFF2 617 and DFF3 633, detailed hereinafter, receive an system initialization signal, NRESET, whenever re-initialization is required, going LOW and clocking a HIGH respectively at that time.

Note from FIG. 6 that EVALUATEBUF1 also is inverted, becoming SRCHDFFRST1, waveform-7, feeding back and resetting the search enabling, edge-triggered, set-reset, flip-flop DFF1 619 at t=115+. Resetting flip-flop DFF1 619 drives SEARCHEN_1 LOW, t=17.3, disabling the SEARCH DRIVER 609 and enabling the PRECHARGE DRIVER 615 and CORE PRECHARGE 613 circuitry as NPREML2, waveform-4 goes LOW, t=118.0. The CORE PRECHARGE signal NPREML2 feeds DFF2 617 reset port and EVALUATEBUF1 goes LOW, t=199+. This portion of the CAM 200 system is thus back to its original state, ready for the next clock cycle to begin.

EVALUATEBUF1 going HIGH also triggers encoder signals, waveforms 8 through 13. While SEARCHEN_1 and EVALUATEBUF1 are HIGH, namely from t=113.0 to t=119+, the PRIORITY_ENCODER section 611 generates MATCH and MATCH_ADDRESS signals based on the CAMCORE 105 search results. EVALUATEBUF1 going HIGH turns off the precharge signal for a PRIORITY ENCODER 611, NBANKPRE, waveform-8, goes HIGH, t≅115.5, just as the MATCH signals from the CAMCORE 105, SCTRMATCH, waveform-9, are fed into the FINAL PRIORITY ENCODER 621 (see also FIG. 8, element 113'). Furthermore, EVALUATEBUF1 drives the BANK ENCODER DELAY 623, DUMMYENC waveform 10, which waits for the amount of time needed for the BANK PRIORITY ENCODER 625 to generate a MATCH signal, waveform-12, and send it to the FINAL PRIORITY ENCODER 621, then it turns off the FINAL ENCODER PRECHARGE 627 for the FINAL PRIORITY ENCODER 621.

When, following the end of a search cycle and SEARCHEN_1 goes LOW, NPREML2 goes LOW, t=118.0–119.0, restarting the precharge of the CAMCORE 107 cells, it also pulls the MATCH output lines from the CAMCORE to LOW and starts the precharge of the BANK PRIORITY ENCODER 625 as the PRIORITY ENCODE PRECHARGE 620 signal NBANKPRE goes low, t=121.0–122.0. As before, the precharge signal, NBANKPRE, feeds through the BANK ENCODER DELAY 623 and turns on the FINAL ENCODE PRECHARGE 627 just as the BANK PRIORITY ENCODER 625 stops driving the FINAL PRIORITY ENCODER 621. Sometime during this process time, the desired output MATCH and MATCH_ADDRESS signals appear on the output ports of the CAMCORE 105. The time at which this happens and the length of time these CAMCORE outputs remain valid is search process, voltage and temperature dependent. The desired action is to hold the outputs until after the next CLOCK edge, t=127.5. This is done by placing OUTPUT LATCHES 631 on the FINAL PRIORITY ENCODER 621 outputs MADDR, waveform-13, LATCHMOUT, where the OUTPUT LATCHES 631 are set at t=118+ and release the latched bits at t=128+ following the CLOCK cycle falling edge at t=127.5, and FBMAT1, waveform-11.

The OUTPUT LATCHES 631 are also self-timed; an edge-triggered, set-reset, flip-flop DFF3 633 is triggered, LATCHMOUT, waveform-13, by the MATCH signal going HIGH, t=16.5–117.5, causing the MATCH and MATCH_ADDRESS signals to be latched. The OUTPUT LATCHES 631 remain closed until reset by the falling edge of the CLOCK at t=127.5. Note that if no match occurs on a particular search, the OUTPUT LATCHES 631 will not close since the CAMCORE 105 will continuously output the desired LOW values during a no match search cycle.

Thus, once the memory bank encoder has the data, the cam cores can start precharging. Once the final encoder has the data, the bank encoder can start precharging and one of the output latches can close, allowing the final encoder to start precharging. Conversely, the bank encoder does not stop precharging until the cam cores have search data to send. The final encoder does not stop precharging until the bank encoder has data to send. The output latches are set to open on the falling edge of the clock cycle rather than when the final encoder has data to send. Note that in an alternative embodiment the functionality can be reversed. The present invention provides a CAM search functionality which self-times CAMCORE precharge functions and latched output MATCH and MATCH_ADDRESS signals. A FINAL_ENCODING 113' can be provided as explained herein before.

Priority Encoding

Figure 9B:
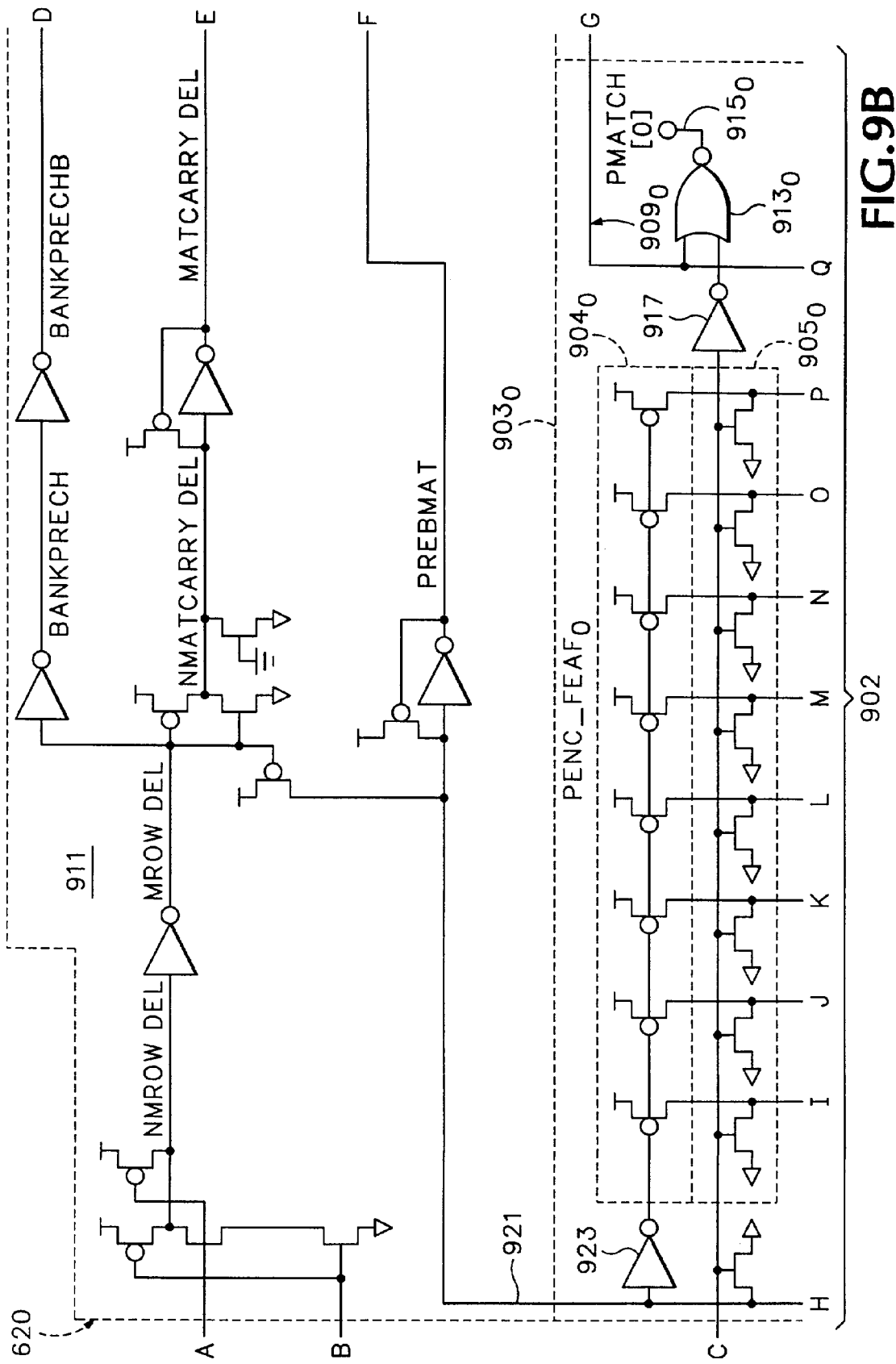
Figure 9D:
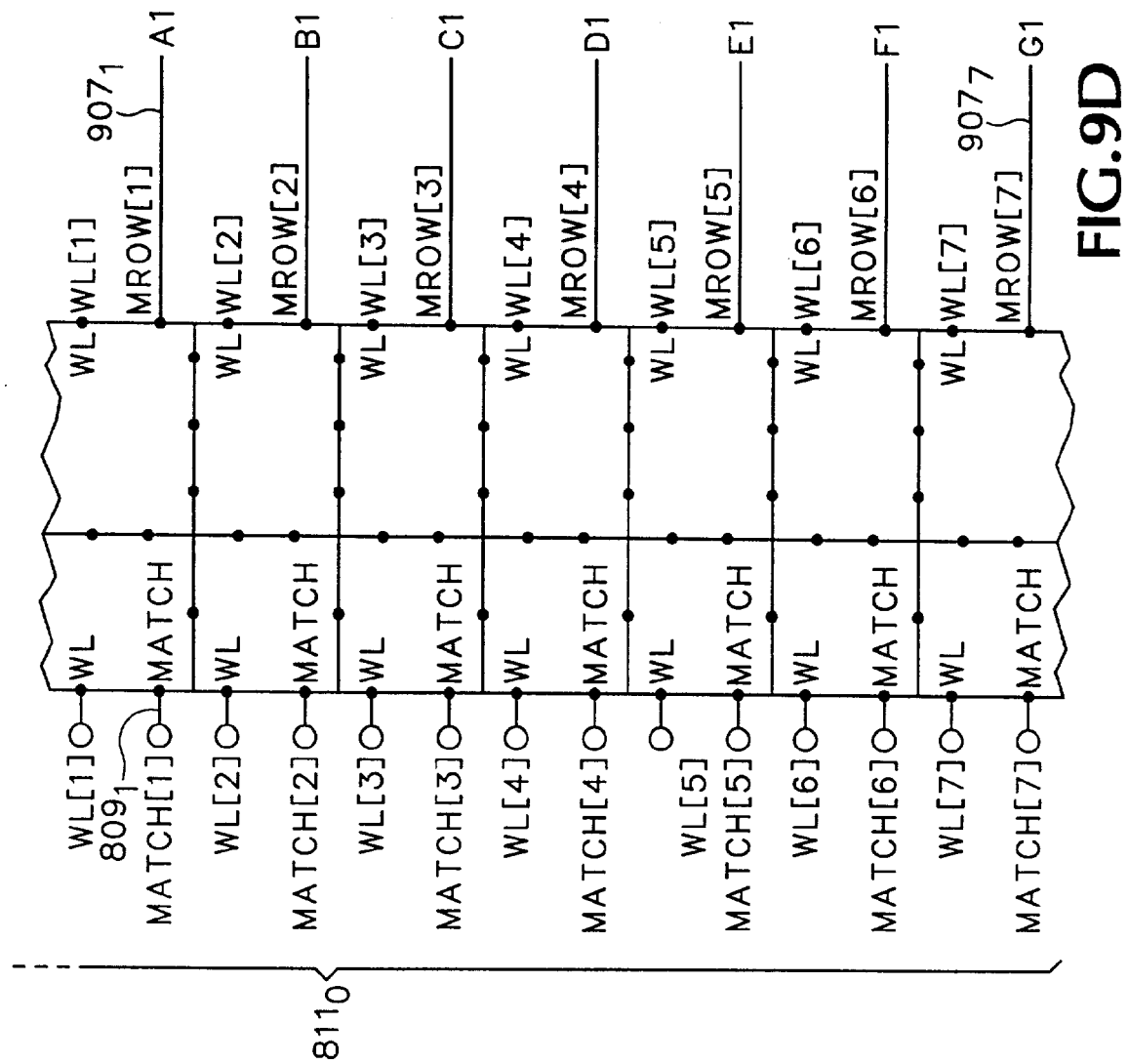
Figure 9E:
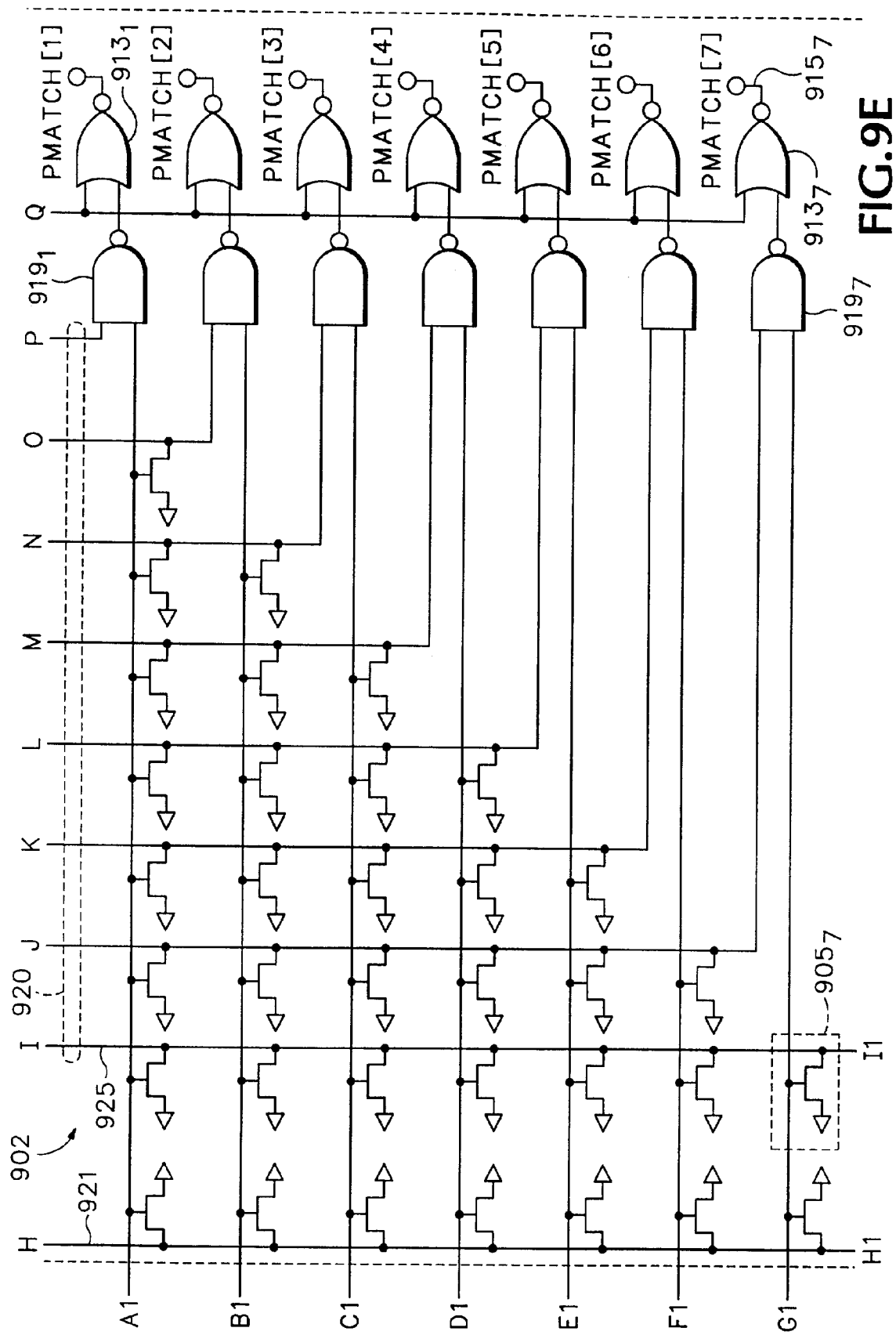
Figure 9F:
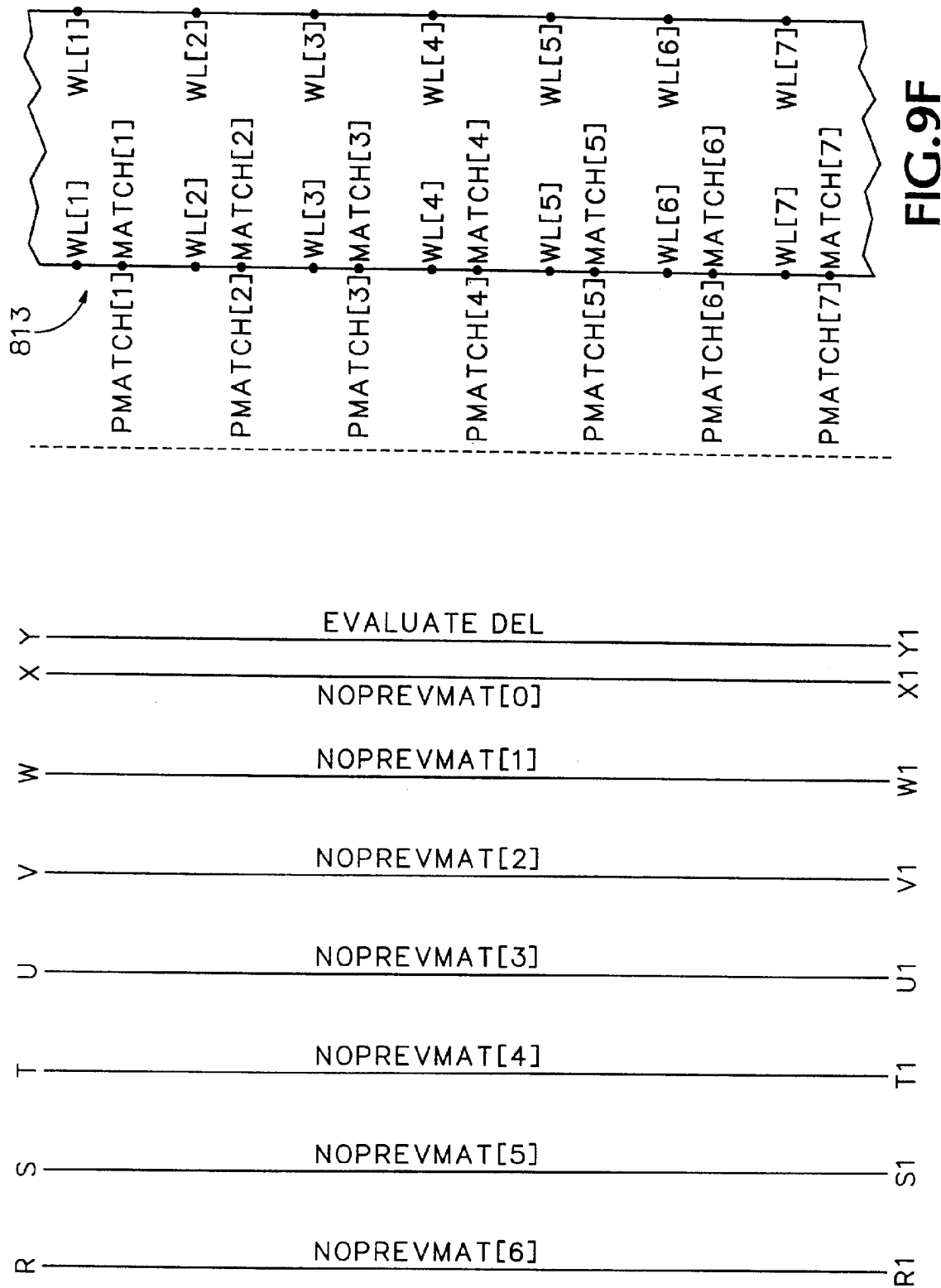
Figure 9G:
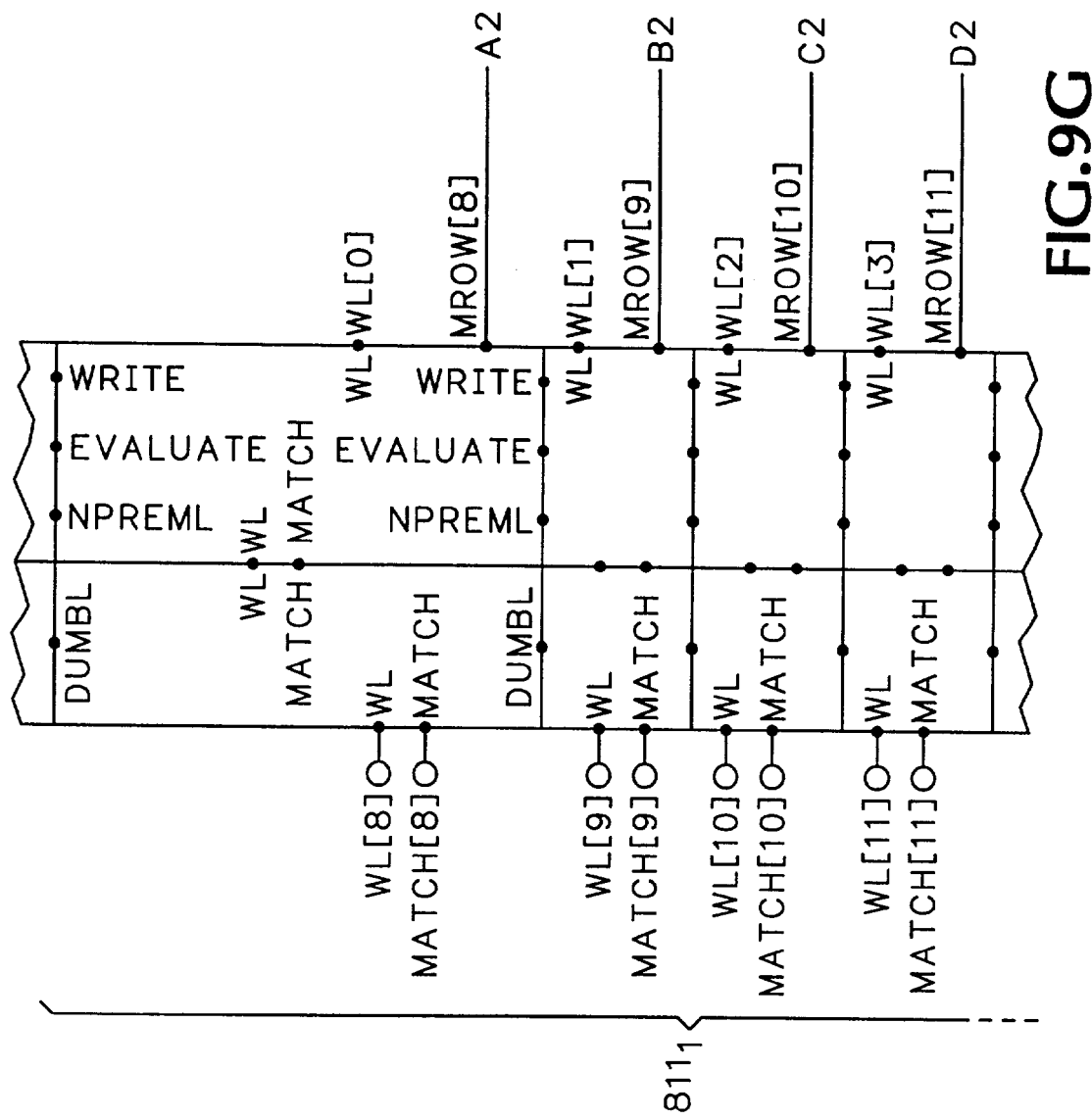
Figure 9H:
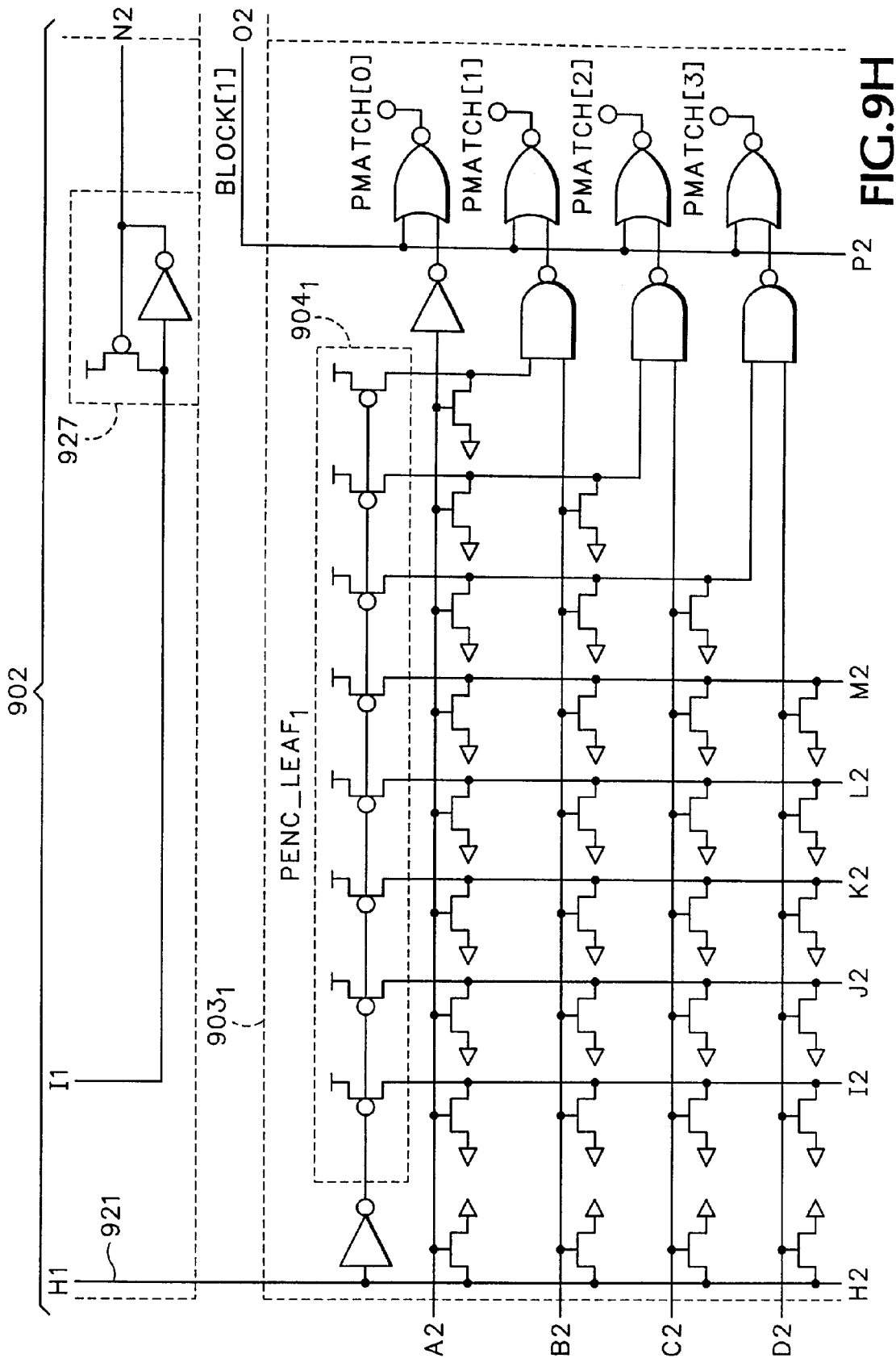
Figure 9I:
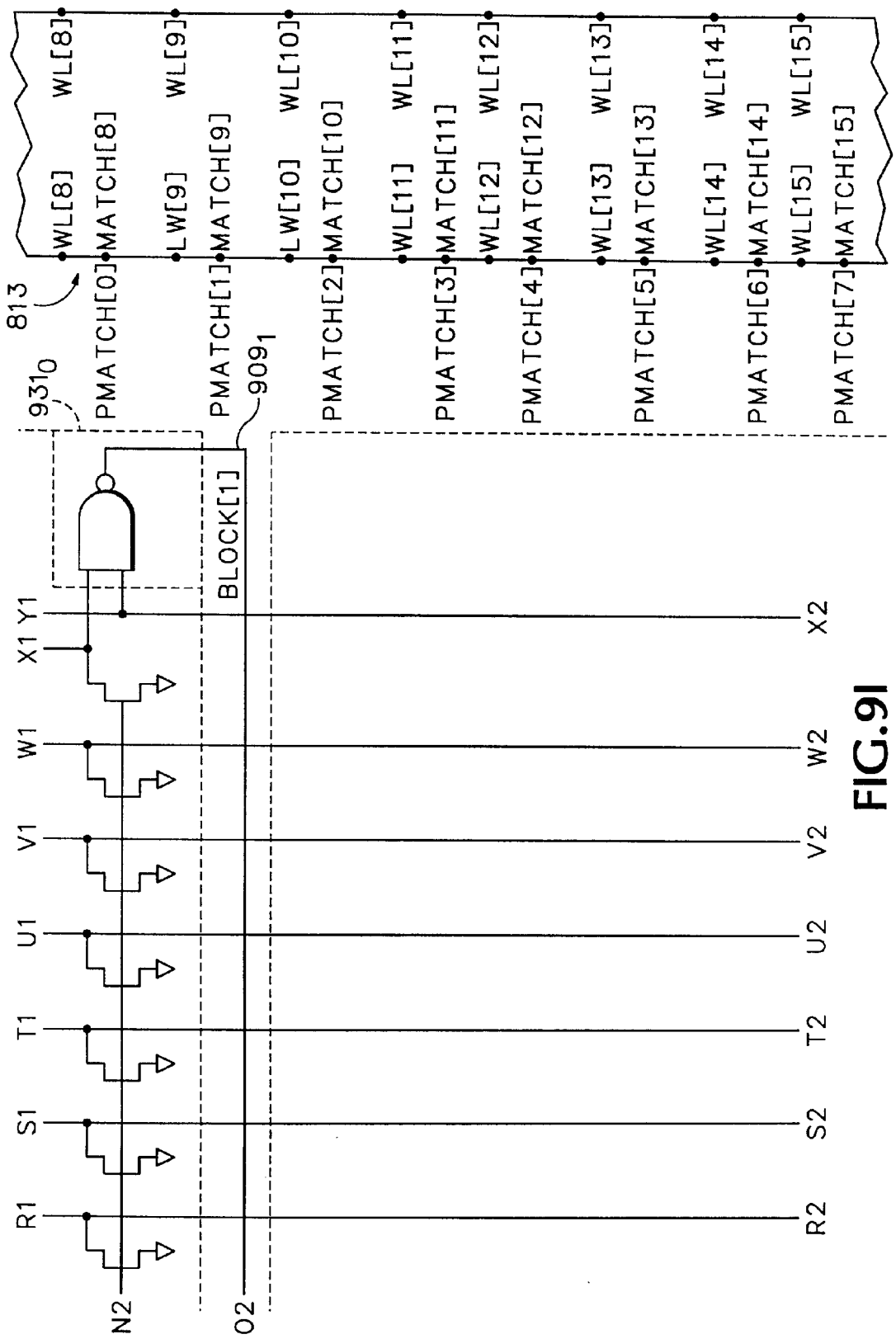
Figure 9J:
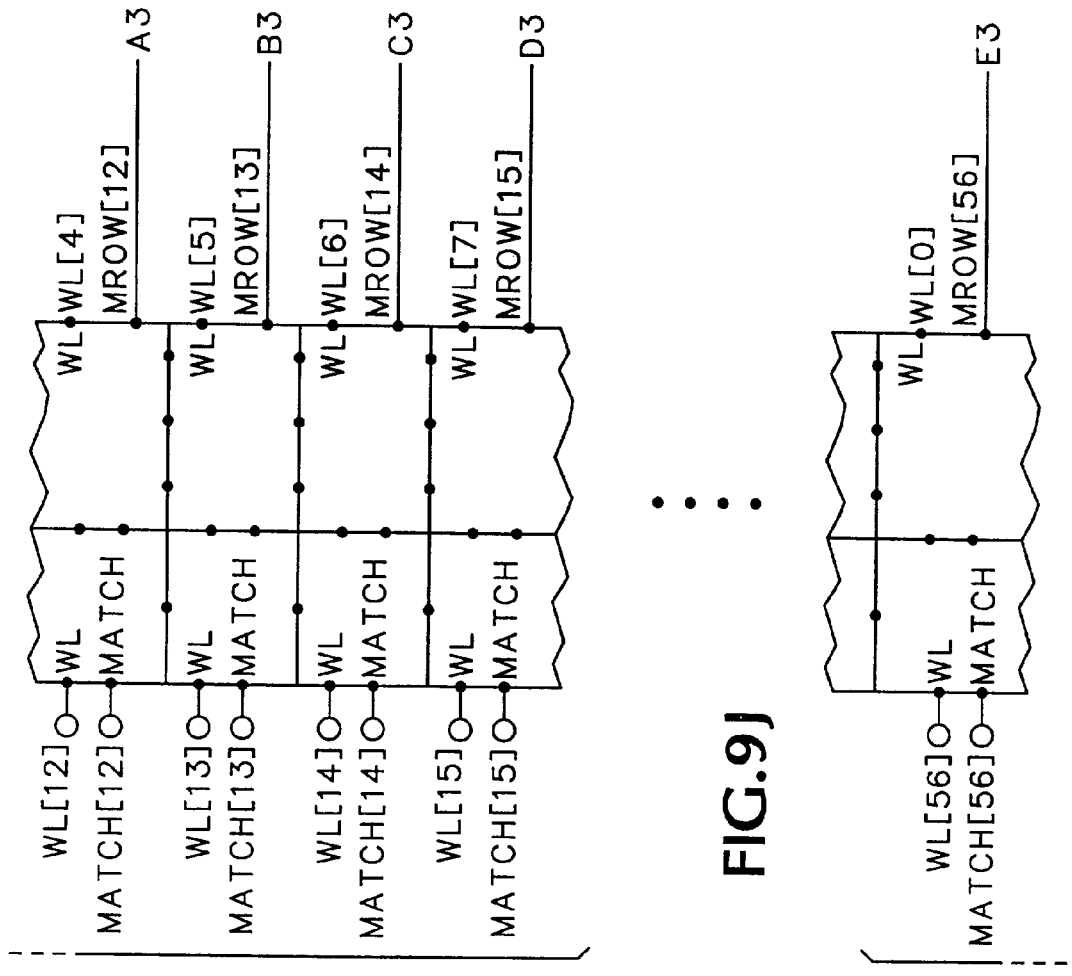
Figure 9K:
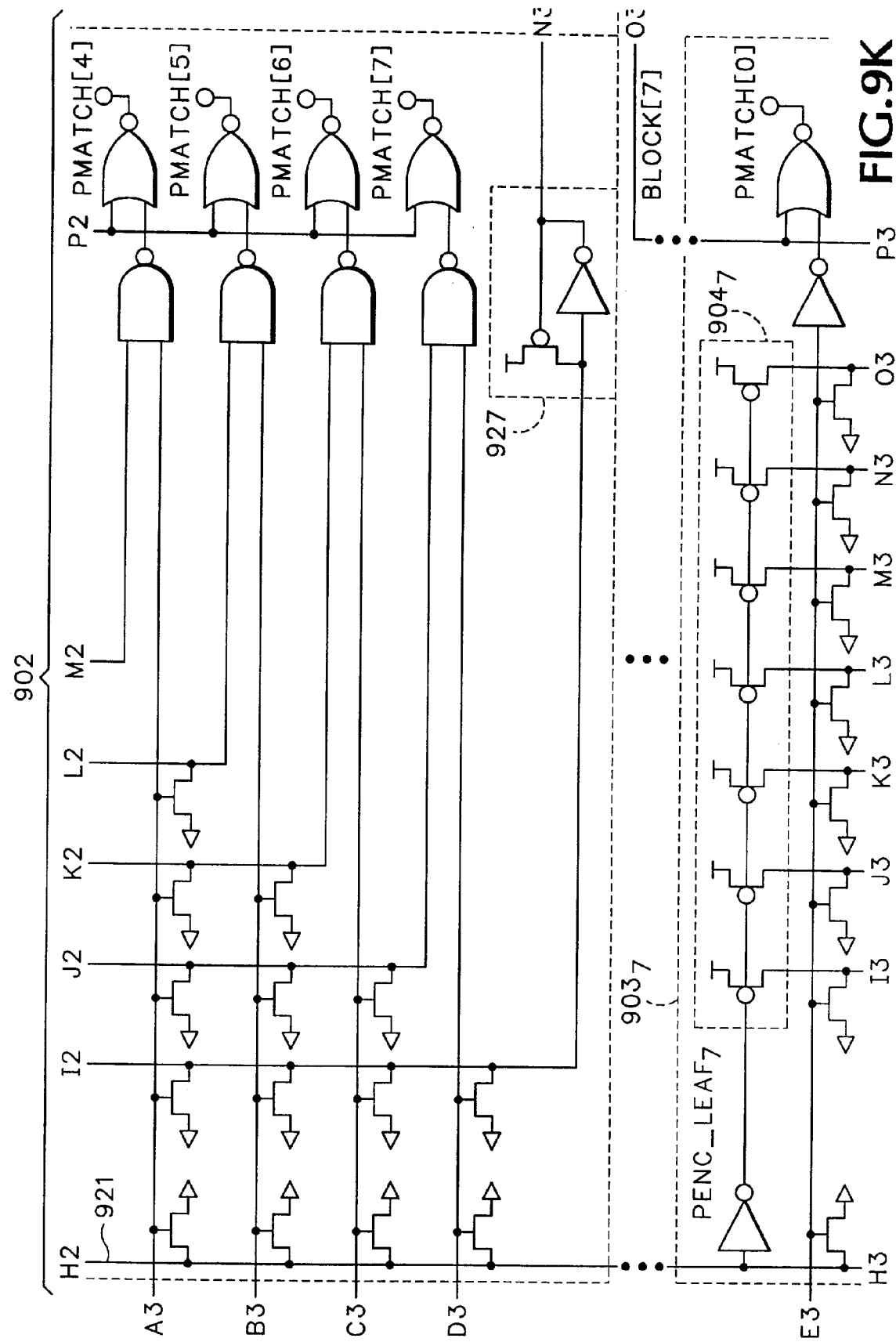
Figure 9L:
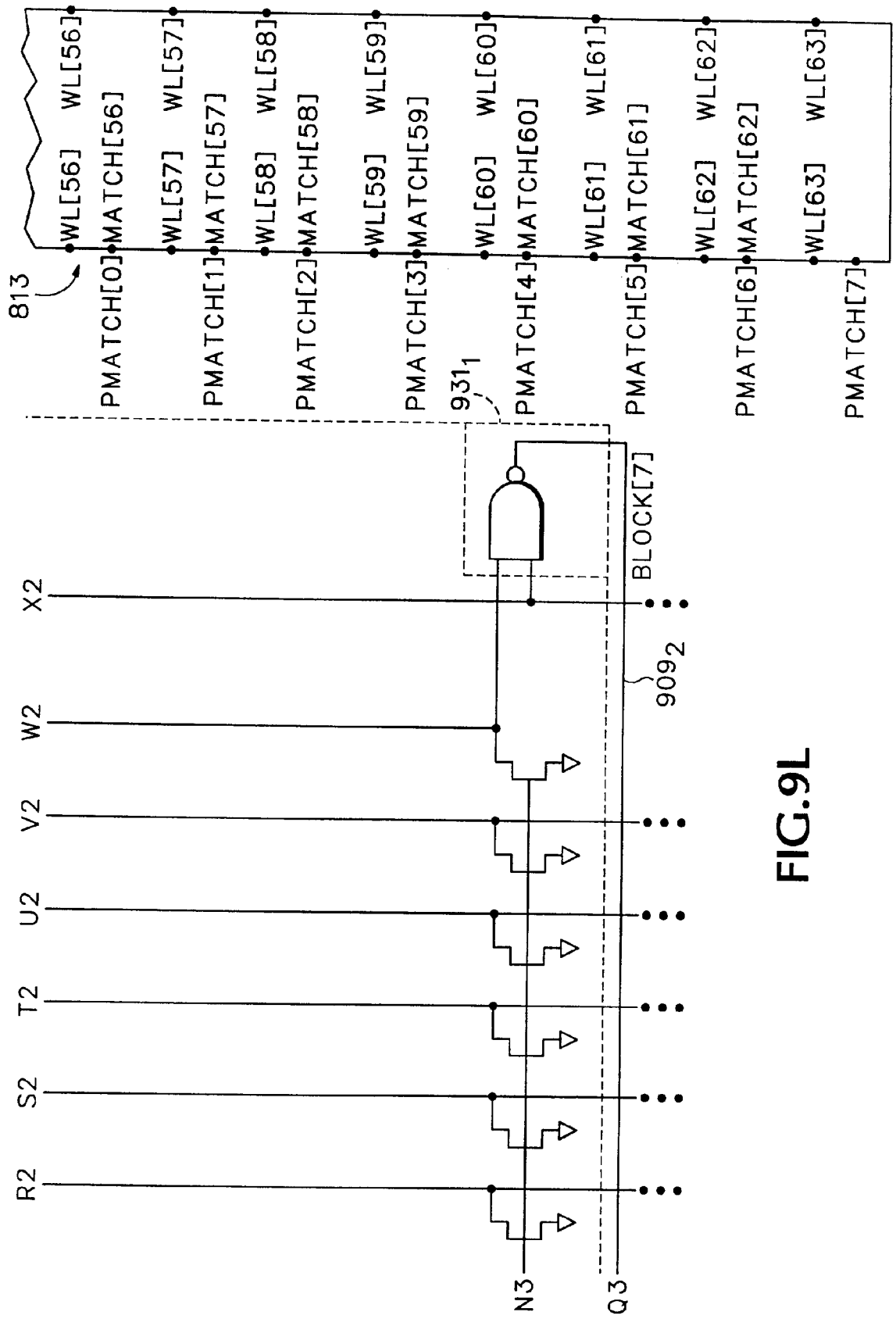
Figure 9M:
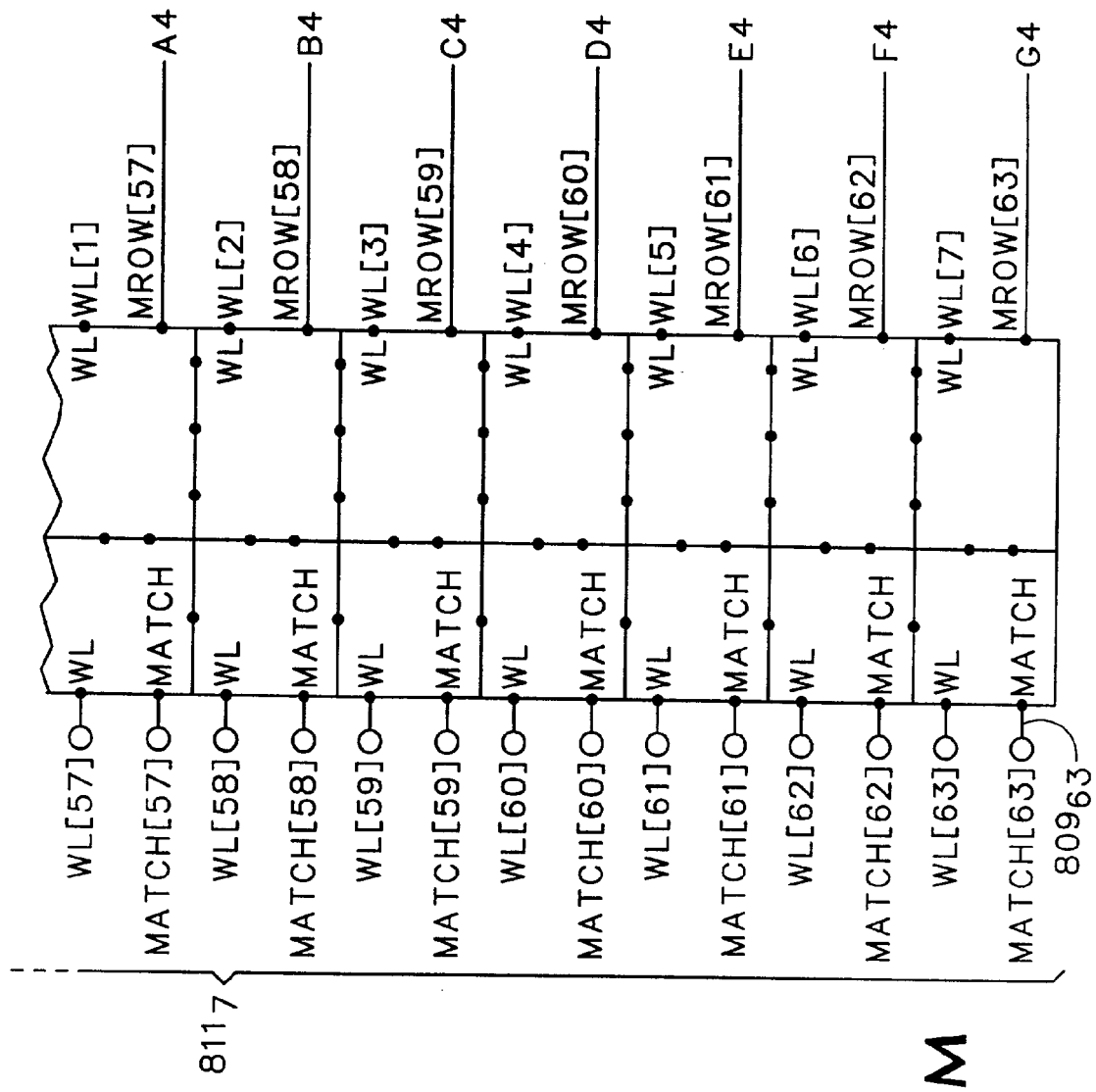
Figure 9N:
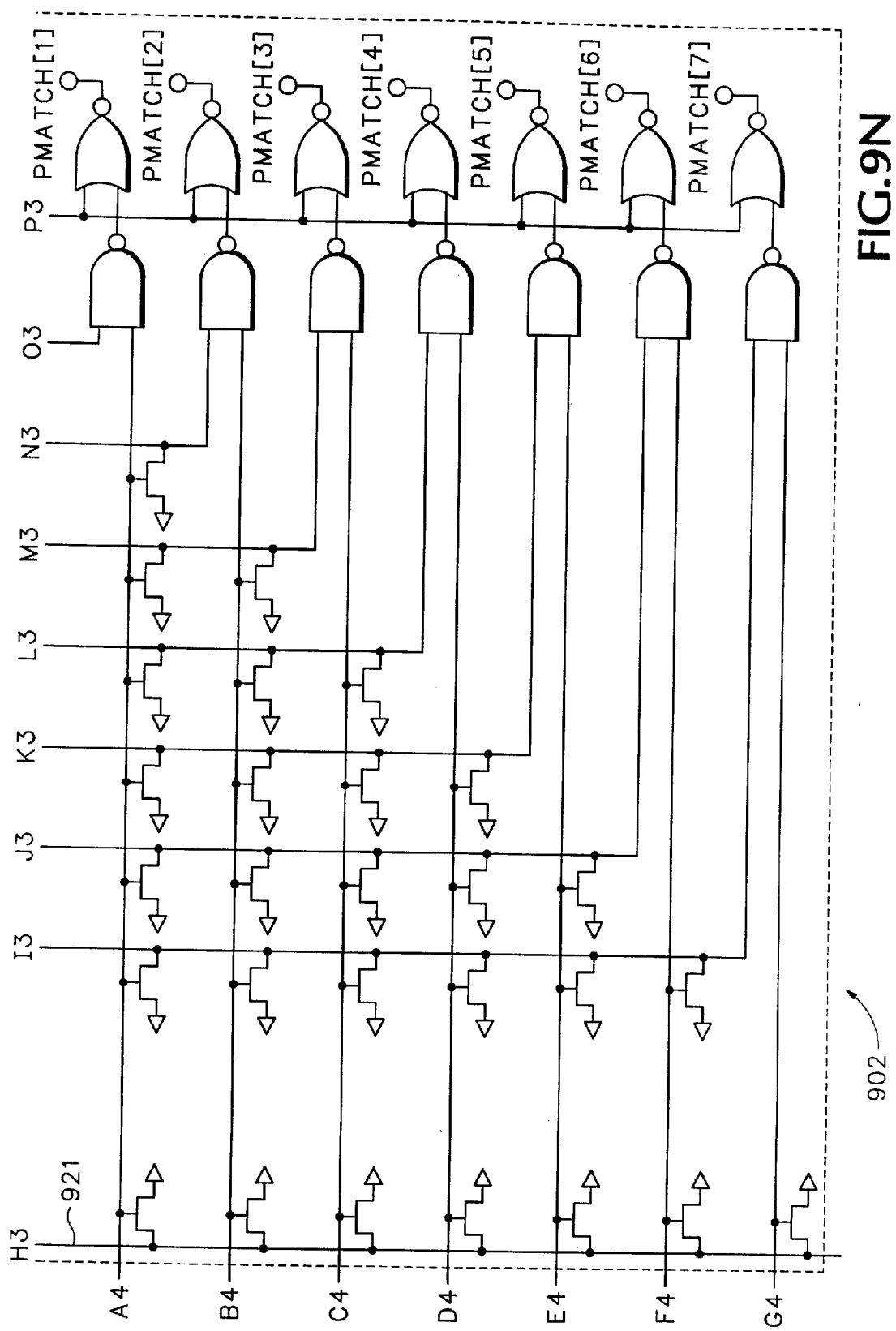

Turning also to FIGS. 9A–9N, to be arranged as shown in the map of to FIG. 9, a detailed circuit diagram of a PRIORITY_ENCODER $811_{0-N}$ and ADDRESS_ENCODER $813_{0-N}$ is shown in detail. The first stage 901 is an input buffer as would be commonly known to the state of the art. The second stage 902 consists of a set of priority encoder cells, or leafs, 903 for N=7, $PENC\_LEAF_{0-7}$, $903_{0-7}$, one for each of the 8-bit inputs from the 64-bit divided CAM_CORE outputs 809. That is, each set of eight PENC_LEAF circuits as shown in FIGS. 9A–9N corresponds to one of the PRIORITY_ENCODERS $811_0$–$811_{11}$ of FIG. 8. A third stage 813 corresponds to the ADDRESS_ENCODERS $813_0$–$813_{11}$ of FIG. 8.

Each $PENC\_LEAF_N$ $903_N$ circuit of the set of eight in each PRIORITY_ENCODER $811_{0-6}$ is substantially identical; the reason for the difference in PRIORITY_ENCLODER $811_7$ will become clear as this detailed description progresses. A precharge circuit $904_{0-7}$ is provided for each PENC_LEAF circuit $903_{0-7}$; these are analogous to FIG. 6, element 620. Each $CAM\_CORE_{0-11}$ 105, FIG. 8, with its respective 64 outputs is coupled to such a set of eight $PENC\_LEAF_{0-7}$ circuits.

Taking PRIORITY_ENCODER $811_0$ as an example, wired-NOR gates $_{0-7}$ are connected to input lines, MROW [0–7] 907 at the input of each of the eight PENC_LEAF cells for a total of 64 inputs to each of the PRIORITY_ENCODERS $811_0$–$811_7$ from the CAM_CORES $105_{0-11}$, FIG. 8.

On the output side, a BLOCKIN signal, a timing signal, 909 is generated—initially to block any address information from being output from a PRIORITY_ENCODER $811_N$ to the ADDRESS_ENCODER $813_N$—using the precharge circuit 911. Each PRIORITY_ENCODER $811_N$ will generate blocking signals to block any information indicative of an address higher than the first matching address. When the BLOCKIN signal 909 is released, the PRIORITY_ENCODER blocking signals will have established to block signals indicative of any higher address than the first; only the lowest matching address signal is not blocked.

BLOCKIN signal 909 is fed to each of the last NOR gates 913[0–7] of the PENC_LEAF circuitry on the eight, output-prioritized lines, PMATCH[0–7], 915. If BLOCKIN is HIGH, PMATCH will be LOW. When BLOCKIN is LOW, if the other input to the last NOR gate 913 is LOW, then PMATCH will go HIGH. For MROW$_0$, however, an inverter 917 is used at the output of the wired-NOR line 905$_0$; BLOCKIN will block the MATCH signal from MROW$_0$ until released; then, if MROW$_0$ is true, the input to the last NOR gate 913[0] will be LOW and PMATCH will go HIGH. For MROW[1–7], the input to the last NOR gates 913[1–7] is from a NAND gate 919; one gate 913 input A is BLOCKIN and the other gate 913 input B is from the MROW[1–7] input via NAND gate 919; the NAND gate 919 inputs are from the wired-NOR 905 output and from MROW$_0$, NBLOCK[1–7] lines 920 which goes LOW if MROW$_0$ is a match. In other words, any NBLOCK 920 signal going HIGH, prevents a subsequent MROW signal from getting through the NAND gate and only the first MROW match going HIGH is passed through a PENC_LEAF 902 stage. That is to say, PMATCH output signals depend on BLOCKIN and NBLOCK and MROW signals. In other words, NBLOCK[1–7] 920 are blocking for a subsequent PMATCH line$_{1-7}$, respectively.

For example, assume MROW[0–7] is {0, 0, 1, 1, 1, 0, 0, 1}.

At precharge, BMATCH line 921 is HIGH. Any MROW going HIGH will bring BMATCH LOW. BLOCKIN on line 909 is HIGH.

After a search, possibly some or all of the input signals, MROW, to the priority encoder 811 are HIGH; specifically in this example, MROWs [2], [3], [4], and [7].

Having at least one input HIGH, BMATCH goes LOW. Inverter 923 signal, PRENCARRY, goes to HIGH, disabling the precharger stage 904 for the wired-NOR logic 905 of the MROW lines 907[0–7]. NMATCARRY on line 925 and the NBLOCK[1–7] lines 920 all go LOW.

MROW[0] and MROW[1] are LOW, no-match indicator signal inputs, and do not affect the wired-nor gates 905 on those lines.

Looking to MROW[0], inverter 917 will provide MROW [0] last gate 913[0] to have a HIGH on input B. BLOCKIN still being HIGH on input A.

Looking to MROW[1], the NAND gate 919[1] on MROW[1] has a LOW MROW no-match indicator signal on input B and a HIGH NBLOCK[1] signal from the precharger 904[1] on input A; therefore, its output signal, NPMAT[1] is HIGH, feeding the MROW[1] last gate 913[1] input B. BLOCKIN still being HIGH on input A.

Looking to MROW[2], the first CAM_CORE match HIGH is encountered. MROW[2] NAND gate 919[2] has a HIGH NBLOCK[2] signal on input A and a HIGH MROW [2] signal; therefore, output signal NPMAT[2] is LOW, feeding the MROW[2] last gate 913[2] input B. BLOCKIN still being HIGH on input A.

At the same time, MATCARRY and NBLOCK[7-3] OR gates will now all go LOW.

MROW[3–7] NAND gate 919[3–7] inputs A are all LOW; B inputs following the MROW[3–7] signal. However, with the inputs A all at a LOW, the NPMAT[3–7] signals will all be HIGH, feeding the respective last gates 913[3–7].

Of the eight inputs MROW to the PENC_LEAF circuit stage, the least matching address bit is identified as MROW [2].

MATCARRY is changed to HIGH by inverter 927.

At the appropriate time, BLOCKIN is released, going LOW. Only the priority encoder output gates for MROW[2] however provide a last gate 913[2] LOW-A, LOW-B input; therefore, only PMATCH[2] goes HIGH on line 915[2]. That is, for wired-NAND logic both inputs need to be HIGH for a LOW out and when BLOCKIN goes HIGH, the output is {0, 0, 1, 0, 0, 0, 0, 0,}, where the NBLOCK[3] has blocked MROW[3] HIGH match signal, NBLOCK[4] has blocked MROW[4], NBLOCK[5] has blocked MROW[5], and NBLOCK[7] has blocked MROW[7]. In other words, only the first match, MROW[2], has gotten through PENC_LEAF$_0$ 811$_0$. Generally, this is a condition of PMATCH is HIGH when BLOCKIN goes LOW, else PMATCH is LOW unless an NBLOCK line 920 is HIGH and MROW is HIGH conditions exist.

PMATCH signals carry directly over to the ADDRESS_ENCODER 813 (see also FIG. 8, 811 to 813). If any MATCARRY signal on line 925 goes HIGH, all NOPREVMAT signals subsequent on lines 929 go LOW, feeding the B input of respective NAND gate 931$_0$. The A input of the NAND gates 931 is EVALUATEDEL timing signal on line 933. The NAND gate 931 output is the BLOCKIN signal for the subsequent PENC_LEAF circuit of the tree on line 329. Initially, EVALUATEDEL is LOW, NAND 931 having a HIGH output, holds BLOCKIN HIGH. When EVALUATEDEL goes HIGH, BLOCKIN [0–7] will go LOW as long as the corresponding NOPREVMAT signal is HIGH.

NMATCARRY goes HIGH during a precharge, is inverted by inverter 927 to be LOW as MATCARRY, then goes HIGH when any first MROW signal is HIGH. EVALUATEDEL from the precharge circuit 911 is combined through a NAND gate 931 with MATCARRY and a signal indicative of no previous match, NOPREVMAT[0–6] 929. Note that the seventh stage 811$_6$ having no subsequent stage in the tree to control, therefore not requiring the circuitry. That is, a MATCARRY HIGH will pull NOPREVMAT lines LOW. Thus, a subsequent PENC_LEAF circuit can be blocked either by the timing signal EVALUATEDEL or by a previous PENC_LEAF circuit MATCARRY. Again, matches in stages subsequent to the first match do not get through the priority encoder stage 902. Thus, MATCARRY signals from each PENC_LEAF becomes an appropriate BLOCKIN for all subsequent PENC_LEAF of the tree. That is, the MATCARRY signal line 925 carries the blocking function to block the next subsequent stages PENC_LEAF$_{1-6}$ circuitry in the tree of circuits as depicted in FIGS. 9A–9N.

Now only one or less of the sixty-four bit lines out each of the PRIORITY_ENCODER 811 into the ADDRESS_ENCODER 813 is HIGH. If one is HIGH, it is encoded into the six-bit MATCH_ADDRESS lower bits; if none are HIGH, address zero is indicated.

The pull down transistors of each PENC_LEAF NBLOCK line 920 are wired-NOR logic, made possible through the use of the precharge circuitry 904. This increases the speed of the circuitry significantly. A single precharge can bring each to a HIGH. This configuration eliminates the need for full gate logic to decode and keep track of each and every match row line, in the exemplary embodiment 768 entries, individually.

NPREVMAT is also wired-NOR logic.

In FIG. 8, PRIORITY_ENCODER_FINAL 813 circuitry (analogous to FIG. 1, element 114) has 12 inputs, one for each CAM_CORE 105$_{0-11}$ of the exemplary embodiment. The output providing the upper four bits of the MATCH_ADDRESS, effectively pointing to the specific CAM_CORE of the twelve in the bank where the data is found. The use of the MATCH signal in this manner is described in detail above as in parent U.S. patent application Ser. No. 08/664,902.

Thus, the ADDRESS_ENCODER $813_N$ output is lower 6-bits of the MATCH_ADDRESS of a match in its respective CAM_CORE$_N$ and the PRIORITY_FINAL_ENCODER 813 output is the higher 4-bits, indicating the bank. Note that there are a possibility of twelve sets of the 6-bit addresses being generated, one for each PRIORITY_ENCODER $811_0$–$811_{11}$. Based upon the determination of the lowest matching bank of the CAM_CORES $105_{0-11}$, it will select one of the twelve 6-bit buses and concatenate with the supper bits for the MATCH_ADDRESS from the PRIORITY_ENCODER_FINAL circuitry, thus providing the necessary 10-bit MATCH_ADDRESS.

The present invention thus provides a priority encoding of associative data retrieval, multiple hits by a method of dividing and capturing the first available data set. Since the bank identifying bits are available well before row bits, the present invention takes the advantage to generate upper bits of the match address ahead of time.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. A method of prioritizing redundant signals of an electronic apparatus having a plurality of output digital bit signals adapted to be combined to form concatenated digital signals composed of plurality of bits specifying a predetermined signal content, and said apparatus having redundant digital signal outputs specifying said predetermined signal content, the method comprising the steps of:

dividing said plurality of output digital bit signals into sets, each of said sets adapted to have full signal content of a concatenated digtal signal; and concatenating only first engaged digital bit signals and blocking each subsequent bit signal of each of said sets such that only a first engaged concatenated digital signal is output specifying said predetermined signal content.

2. The method as set forth in claim 1, said step of concatentating further comprising:

using a first engaged bit signal to generate a blocking signal to subsequent bit signals of each of said sets.

3. A content addressable memory (CAM) circuit device comprising:

a plurality of CAMs, each of said CAMs having a cell array of addressable cell means for storage of data bits therein, a MATCH signal line connected to each cell for transmitting MATCH signals on each respective said MATCH signal line, and a plurality of MATCH ADDRESS signal lines for transmitting MATCH ADDRESS signals on said respective MATCH ADDRESS signal lines;

connected to each of said CAMs to receive each MATCH signal and each MATCH ADDRESS signal therefrom, a plurality of means for prioritizing said MATCH signals and said MATCH ADDRESS signals received from said CAMs on respectively connect inputs of said means for prioritizing such that only a first MATCH signal and a first MATCH ADDRESS signal from a first of said plurality of CAMS are transmitted on an output of said means for prioritizing; and means for combining bits of said first MATCH ADDRESS signal indicative of the CAM cell array in the bank providing the first MATCH signal and the first MATCH ADDRESS signal and for outputting a MATCH ADDRESS$_F$ signal designating both which said array in the bank provided the first MATCH signal and an address within said array wherein matched content data is stored in said device.

4. The device as set forth in claim 3, wherein means for prioritizing said further comprises:

an input buffer for receiving MATCH signals and MATCH ADDRESS signals from one of said plurality of CAMS, connected to said input buffer, a plurality of signal priority encoding circuits wherein each of said signal priority encoding circuits includes means for encoding each MATCH ADDRESS signal and means for blocking each MATCH ADDRESS signal other than said first MATCH ADDRESS signal.

5. The device as set forth in claim 4, further comprising:

each of said signal priority encoding circuits having an output precharging circuit including wired-NOR circuits triggered by MATCHrow signal said CAM.

6. The device as set forth in claim 3, wherein said means for encoding further comprises:

sets of wired-NOR circuits coupled to MATCH row signal lines such that only a first engaged MATCH row signal is output by each of said sets of wired-NOR circuits.

7. A content addressable memory (CAM) system with a priority encoder apparatus comprising:

a plurality of CAM cores, each containing data such that redundant MATCH signals and MATCH ADDRESS signals can be output therefrom on output bit lines thereof;

a plurality of priority encoders connected to receive each said MATCH signal and MATCH ADDRESS signals from one of said plurality of CAM cores, respectively, each of said priority encoders having an input signal buffer connected to each output bit line of one of said plurality of CAM cores, respectively, to receive MATCH signal bits and MATCH ADDRESS signal bits, a plurality of priority encoding circuit means, divided into $N^2$ sets, where $N^2$=the number of MATCH ADDRESS signals inputs from each CAM core, for encoding MATCH signal bits and MATCH ADDRESS signal bits and for blocking MATCH signal bits and MATCH ADDRESS signal bits of subsequent to first active MATCH signal bits and first active MATCH ADDRESS signal bits in each set; and an address encoder for receiving MATCH signal bits, MATCH ADDRESS signal bits, blocked MATCH signal bits, and blocked MATCH ADDRESS signal bits such that only first active MATCH signal bits and first active MATCH ADDRESS signal bits are concatenated, providing only a first MATCH output signal and first MATCH ADDRESS output signal from said system.

* * * * *